(12) United States Patent
Kwag et al.

(10) Patent No.: US 12,495,644 B2
(45) Date of Patent: Dec. 9, 2025

(54) DISPLAY DEVICE WITH NON-OVERLAPPING SHIELDING ELECTRODE LAYER

(71) Applicant: Samsung Display Co., Ltd., Yongin-si (KR)

(72) Inventors: Jin Oh Kwag, Suwon-si (KR); Hyun Deok Im, Seoul (KR); Keun Kyu Song, Seongnam-si (KR); Sung Chan Jo, Seoul (KR); Hyun Min Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 599 days.

(21) Appl. No.: 17/297,950

(22) PCT Filed: Aug. 23, 2019

(86) PCT No.: PCT/KR2019/010727
§ 371 (c)(1),
(2) Date: May 27, 2021

(87) PCT Pub. No.: WO2020/111452
PCT Pub. Date: Jun. 4, 2020

(65) Prior Publication Data
US 2022/0093828 A1   Mar. 24, 2022

(30) Foreign Application Priority Data

Nov. 27, 2018 (KR) .......................... 10-2018-0148353

(51) Int. Cl.
*H01L 27/12* (2006.01)
*H01L 25/16* (2023.01)
(Continued)

(52) U.S. Cl.
CPC ........ *H10H 20/831* (2025.01); *H10H 29/142* (2025.01)

(58) Field of Classification Search
CPC ......... H01L 33/38; H01L 33/16; H01L 33/62; H01L 33/18; H01L 33/42; H01L 33/40;
(Continued)

(56) References Cited

U.S. PATENT DOCUMENTS 8,287,159 B2 * 10/2012 Kato .................... H10K 50/856
                                                     362/346
9,329,433 B2    5/2016 Negishi et al.
(Continued)

FOREIGN PATENT DOCUMENTS

CN       107210350 A      9/2017
CN       110400819 A     11/2019
(Continued)

OTHER PUBLICATIONS

International Search Report for corresponding Application No. PCT/KR2019/010727 dated Dec. 5, 2019, 4 pages.
(Continued)

*Primary Examiner* — Ajay Ojha
*Assistant Examiner* — Tsz K Chiu
(74) *Attorney, Agent, or Firm* — Womble Bond Dickinson (US) LLP

(57) ABSTRACT

A display device is provided. The display device comprises: a first electrode and a second electrode spaced apart from and arranged to face the first electrode; a first insulating layer arranged to cover at least a partial region of the first and second electrodes; a shielding electrode layer which is arranged on the first insulating layer and which does not overlap at least a portion of the first and second electrodes; and at least one light-emitting element arranged between the first and second electrodes so as to be spaced apart from the
(Continued)

shielding electrode layer, wherein the at least one light-emitting element can be arranged in a region in which the shielding electrode layer does not overlap the first and second electrodes.

20 Claims, 32 Drawing Sheets

(51) Int. Cl.
*H10H 20/831* (2025.01)
*H10H 29/14* (2025.01)

(58) Field of Classification Search
CPC . H01L 25/167; H01L 25/0753; H01L 27/156; H01L 23/552
See application file for complete search history.

(56) References Cited

U.S. PATENT DOCUMENTS

| | | | |
|---|---|---|---|
| 9,599,857 B2* | 3/2017 | Bibl | H10H 20/851 |
| 10,026,777 B2 | 7/2018 | Kang et al. | |
| 10,269,865 B2 | 4/2019 | Kang et al. | |
| 10,461,123 B2 | 10/2019 | Kim et al. | |
| 10,943,947 B2 | 3/2021 | Im et al. | |
| 11,367,823 B2* | 6/2022 | Kim | H01L 25/0753 |
| 11,574,954 B2 | 2/2023 | Im et al. | |
| 11,749,709 B2* | 9/2023 | Heo | H10K 59/122 |
| | | | 257/79 |
| 11,824,138 B2* | 11/2023 | Beak | H10H 20/816 |
| 11,990,579 B2* | 5/2024 | Kim | H10H 20/821 |
| 2008/0251381 A1* | 10/2008 | Shibata | C25D 13/02 |
| | | | 204/483 |
| 2011/0254043 A1* | 10/2011 | Negishi | H01L 33/20 |
| | | | 438/22 |
| 2013/0027623 A1 | 1/2013 | Negishi et al. | |
| 2013/0082271 A1* | 4/2013 | Kanegae | H01L 27/124 |
| | | | 438/34 |
| 2014/0027709 A1* | 1/2014 | Higginson | H01L 33/44 |
| | | | 438/26 |
| 2014/0159064 A1* | 6/2014 | Sakariya | H01L 33/36 |
| | | | 257/88 |
| 2015/0349293 A1* | 12/2015 | Park | H10K 50/841 |
| | | | 257/40 |
| 2017/0133550 A1 | 5/2017 | Schuele et al. | |
| 2017/0141279 A1* | 5/2017 | Do | H01L 33/0075 |
| 2017/0184932 A1 | 6/2017 | Park et al. | |
| 2018/0012876 A1 | 1/2018 | Kim et al. | |
| 2018/0019369 A1* | 1/2018 | Cho | H01L 33/44 |
| 2018/0108704 A1* | 4/2018 | Jang | H01L 33/60 |
| 2018/0122836 A1* | 5/2018 | Kang | H01L 27/1248 |
| 2018/0122837 A1* | 5/2018 | Kang | H01L 27/124 |
| 2018/0158987 A1* | 6/2018 | Lee | H01L 33/32 |
| 2018/0175009 A1* | 6/2018 | Kim | H01L 33/20 |
| 2018/0175104 A1* | 6/2018 | Kang | H01L 33/005 |
| 2018/0175106 A1 | 6/2018 | Kim et al. | |
| 2018/0197461 A1 | 7/2018 | Lai et al. | |
| 2018/0301504 A1 | 10/2018 | Kang et al. | |
| 2019/0245005 A1 | 8/2019 | Kang et al. | |

FOREIGN PATENT DOCUMENTS

| | | | | |
|---|---|---|---|---|
| JP | 2012-004535 | A | 1/2012 | |
| KR | 10-1490758 | B1 | 2/2015 | |
| KR | 10-2016-0059569 | A | 5/2016 | |
| KR | 10-2017-0057818 | A | 5/2017 | |
| KR | 10-2018-0009014 | A | 1/2018 | |
| KR | 2018-0007025 | A | 1/2018 | |
| KR | 2018-0007376 | A | 1/2018 | |
| KR | 10-2018-0036882 | A | 4/2018 | |
| KR | 10-2018-0071465 | A | 6/2018 | |
| KR | 10-2018-0072909 | A | 7/2018 | |
| WO | WO-2011111516 | A1 * | 9/2011 | F21K 9/00 |
| WO | WO-2020017719 | A1 * | 1/2020 | H01L 25/0753 |

OTHER PUBLICATIONS

Korean Notice of Allowance issued Feb. 24, 2024, in corresponding Korean Patent Application No. 10-2018-0148353 (2 pages).
Chinese Office Action issued May 22, 2024, in corresponding CN Patent Application No. 201980078388.8 (8 pages).

* cited by examiner

DISPLAY DEVICE WITH NON-OVERLAPPING SHIELDING ELECTRODE LAYER

CROSS-REFERENCE TO RELATED APPLICATION

This application is a U.S. National Phase Patent Application of International Patent Application Number PCT/KR2019/010727, filed on Aug. 23, 2019, which claims priority to Korean Patent Application Number 10-2018-0148353, filed on Nov. 27, 2018, the entire contents of all of which are incorporated herein by reference.

BACKGROUND

1. Field

The present disclosure relates to a display device, and more particularly, to a display device including a shielding electrode layer disposed so as to improve the alignment of light-emitting elements.

2. Description of Related Art

The importance of display devices is increasing along with the development of multimedia. Accordingly, various types of display devices, such as organic light-emitting diode (OLED) displays and liquid crystal displays (LCDs), are being used.

Display devices are devices that display an image and include a display panel such as an organic light-emitting display panel or a liquid crystal display panel. Among these, the display device may include light-emitting elements as a light-emitting display panel. For example, a light-emitting diode (LED) may include an OLED that uses an organic material as a fluorescent material, an inorganic light-emitting diode that uses an inorganic material as a fluorescent material, or the like.

The inorganic light-emitting diode using an inorganic semiconductor as a fluorescent material has durability even in a high temperature environment and has high blue light efficiency as compared with the OLED. In addition, even in a manufacturing process pointed out as a limitation of the conventional inorganic light-emitting diode element, a transfer method using a dielectrophoresis (DEP) method has been developed. Accordingly, research is continuously conducted on an inorganic light-emitting diode having excellent durability and efficiency as compared with an OLED.

SUMMARY

Aspects of the present disclosure provide a display device including a shielding electrode layer disposed so as to improve the alignment of inorganic light-emitting diodes when a display device is manufactured.

It should be noted that objects of the present disclosure are not limited to the above-described objects, and other objects of the present disclosure will be apparent to those skilled in the art from the following descriptions.

According to some embodiments of the present disclosure, a display device includes a first electrode and a second electrode disposed to be spaced apart from and face the first electrode, a first insulating layer disposed to cover at least partial areas of the first electrode and the second electrode, a shielding electrode layer disposed on the first insulating layer and disposed to not overlap at least portions of the first electrode and the second electrode, and one or more light-emitting elements disposed between the first electrode and the second electrode to be spaced apart from the shielding electrode layer, wherein the one or more light-emitting elements are disposed in an area in which the shielding electrode layer does not overlap the first electrode and the second electrode.

The shielding electrode layer may include a first shielding electrode disposed to overlap at least a portion of the first electrode and a second shielding electrode spaced apart from the first shielding electrode and disposed to overlap at least a portion of the second electrode.

The first electrode and the first shielding electrode may be disposed to be spaced apart from the second electrode and the second shielding electrode in one direction across both ends of the light-emitting element, respectively, and a separation distance between the first electrode and the second electrode may be less than a separation distance between the first shielding electrode and the second shielding electrode.

A length of the light-emitting element measured in the one direction may be greater than the separation distance between the first electrode and the second electrode and may be less than the separation distance between the first shielding electrode and the second shielding electrode.

The display device may further include a first contact electrode in contact with the first electrode, one end portion of the light-emitting element, and at least one end portion of the first shielding electrode, and a second contact electrode in contact with the second electrode, the other end portion of the light-emitting element, and at least one end portion of the second shielding electrode.

The display device may further include a second insulating layer disposed in at least a partial area on the first shielding electrode and the second shielding electrode, wherein at least portions of the first contact electrode and the second contact electrode are disposed on an upper surface of the second insulating layer.

The shielding electrode layer may include one or more shielding electrode patterns disposed between the first electrode and the second electrode and spaced apart from each other in a direction in which the first electrode and the second electrode extend, and the first insulating layer may insulate the first electrode and the second electrode from the shielding electrode patterns.

The shielding electrode patterns may be disposed to not overlap the first electrode and the second electrode.

The shielding electrode patterns may partially overlap facing side surfaces of the first electrode and the second electrode.

A width of the shielding electrode pattern measured in a direction in which the first electrode and the second electrode are spaced apart from each other may be greater than a distance between the first electrode and the second electrode.

The light-emitting element may be disposed between the shielding electrode patterns disposed to be spaced apart from each other in the direction in which the first electrode and the second electrode extend.

According to another embodiment of the present disclosure, a display device includes a first electrode and a second electrode which extend in a first direction and are spaced apart from each other in a second direction different from the first direction, a first insulating layer disposed to cover at least partial areas of the first electrode and the second electrode, a shielding electrode layer disposed on the first insulating layer to extend in the first direction and to not overlap at least portions of the first electrode and the second electrode, and one or more light-emitting elements which are disposed between the first electrode and the second electrode to be spaced apart from the shielding electrode layer and both end portions thereof are electrically connected to the first electrode and the second electrode.

The shielding electrode layer may include a first shielding electrode including at least one first recess pattern portion disposed on the first electrode and formed to not overlap at least a portion of the first electrode, and a second shielding electrode including at least one second recess pattern portion disposed on the second electrode and formed to not overlap at least a portion of the second electrode.

The first recess pattern portion may be recessed from one side surface of the first electrode facing the second electrode toward the other side surface of the first electrode, and the second recess pattern portion may be recessed from one side surface of the second electrode facing the first electrode toward to the other side surface of the second electrode.

The first recess pattern portion and the second recess pattern portion may be disposed to be spaced apart and face each other, and the light-emitting element may be disposed between the first recess pattern portion and the second recess pattern portion.

The shielding electrode layer may include at least one shielding electrode pattern portion disposed between the first electrode and the second electrode, and the shielding electrode pattern portion may be spaced apart from another shielding electrode pattern portion adjacent thereto.

The shielding electrode pattern portion may not overlap the first electrode and the second electrode, and the first insulating layer may be exposed in a separation area between the shielding electrode pattern portions to form a pattern in the first direction.

A width of the shielding electrode pattern portion measured in the second direction may be greater than a distance between the first electrode and the second electrode, and the shielding electrode pattern portion may partially overlap the first electrode and the second electrode.

The first electrode may include a first protrusion pattern protruding from at least a partial area of one side surface of the first electrode, which faces the second electrode, and the second electrode may include a second protrusion pattern protruding from at least a partial area of one side surface of the second electrode, which faces the first electrode.

The first protrusion pattern and the second protrusion pattern may be disposed to be spaced apart and face each other, and the light emitting element may have one end portion electrically connected to the first protrusion pattern and the other end portion electrically connected to the second protrusion pattern.

Other details of embodiments for solving the above problems are included in the detailed description and the drawings.

A display device according to some embodiments may include a shielding electrode disposed adjacent to an alignment area for inorganic light-emitting diodes or disposed to form a pattern in a non-alignment area. Because the shielding electrode forms an area in which an electric field is not formed when the inorganic light-emitting diodes are aligned, the inorganic light-emitting diodes can be selectively aligned only in an area in which the shielding electrode is not disposed.

Accordingly, in the display device, the inorganic light-emitting diodes can be aligned to have high alignment in the area in which the shielding electrode is not disposed. In the display device in which the inorganic light-emitting diodes are aligned to have high alignment, emission uniformity for each pixel can be improved, and a loss rate of the inorganic light-emitting diodes can be reduced.

Effects of the present disclosure are not limited to the embodiments set forth herein and more diverse effects are included in this specification.

DETAILED DESCRIPTION

The present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
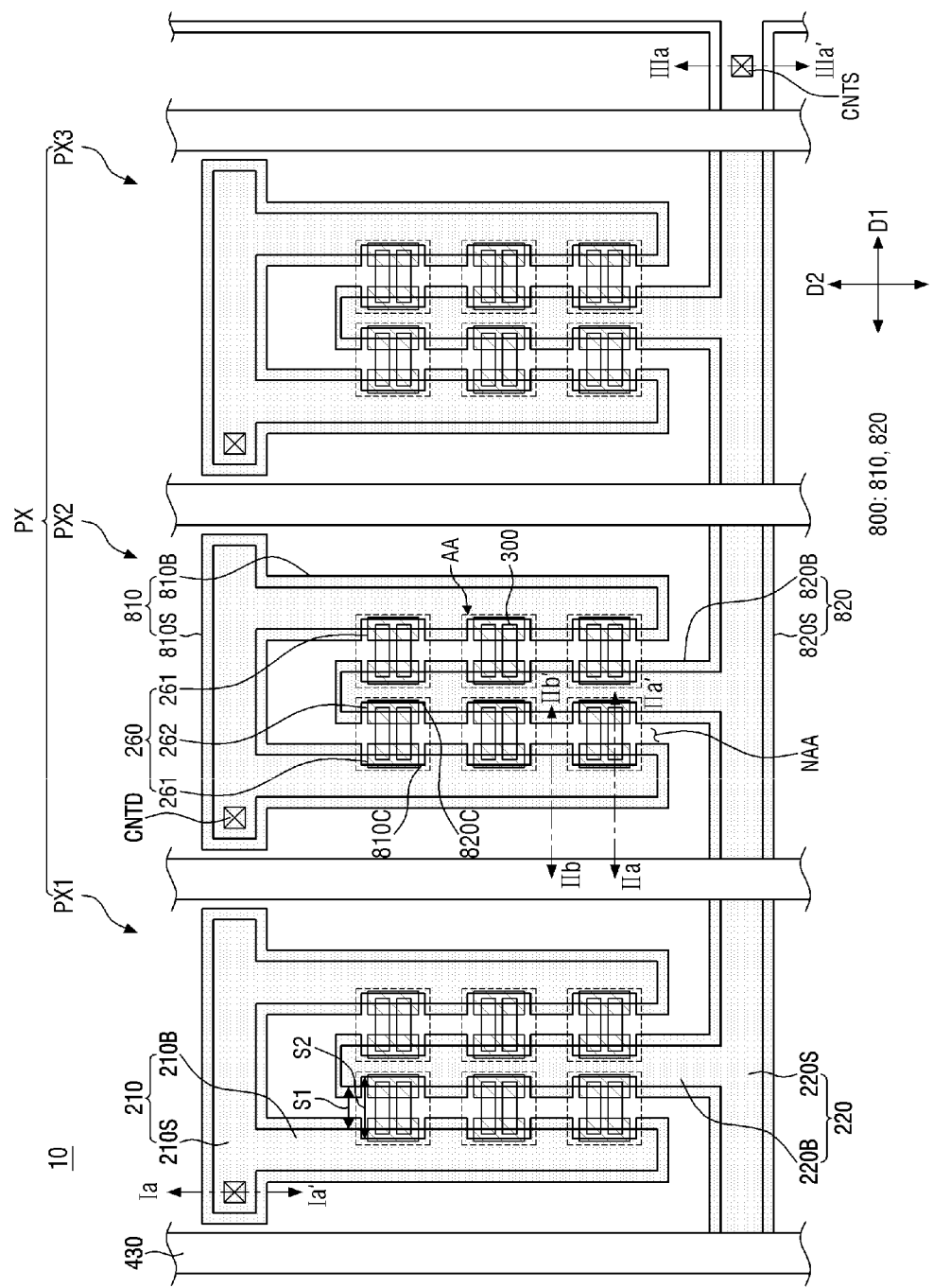
FIG. 1 is a plan view of a display device according to some embodiments.

FIG. 1 is a plan view of a display device according to some embodiments.

Referring to FIG. 1, a display device 10 may include a plurality of pixels PX. Each of the pixels PX may include one or more light-emitting elements 300 configured to emit light having a specific wavelength, thereby displaying a specific color.

Each of the plurality of pixels PX may include a first subpixel PX1, a second subpixel PX2, and a third subpixel PX3. The first subpixel PX1 may emit light having a first color, the second subpixel PX2 may emit light having a second color, and the third subpixel PX3 may emit light having a third color. The first color may be a red color, the second color may be a green color, and the third color may be a blue color, but the present disclosure is not limited thereto. In some cases, subpixels PXn may emit light having the same color. In addition, although FIG. 1 illustrates that each of the pixels PX includes three subpixels, the present disclosure is not limited thereto, and each of the pixels PX may include four or more subpixels.

Each of the subpixels PXn of the display device 10 may include an alignment area AA in which the light-emitting element 300 is disposed and a non-alignment area NAA. The alignment area AA may be defined as an area in which a shielding electrode layer 800 to be described below is not disposed and the light-emitting elements 300 are aligned on exposed electrodes 210 and 220. The non-alignment area NAA may be defined as an area, in which the light-emitting elements 300 are not aligned, other than the alignment area AA.

Meanwhile, in the present specification, the terms such as "exposed" or "exposing" mean that a first member and a second member include an area in which the first member and the second member do not partially overlap each other in a thickness direction thereof. Even when any one member is not exposed to the outside, it can be interpreted by the terms. That is, even when at least one member is disposed between the first member and the second member, if there is an area in which the first member and the second member do not overlap each other in the thickness direction, it may be interpreted that any one member exposes another member or is exposed by another member.

The display device 10 according to some embodiments may include the shielding electrode layer 800 which exposes at least portions of the electrodes 210 and 220 disposed in each pixel PX or subpixel PXn. The shielding electrode layer 800 may be disposed to expose at least portions of the electrodes 210 and 220 and partially overlap the electrodes 210 and 220. The light-emitting elements 300 are aligned in an area in which the electrodes 210 and 220 are exposed, and thus, the alignment area AA is formed. In addition, the non-alignment area NAA is formed in an area other than the alignment area AA, including an area on the electrodes 210 and 220, which is covered by the shielding electrode layer 800.

In a manufacturing process of the display device 10, a process of forming an electric field on the electrodes 210 and 220 to align the light-emitting elements 300 is performed. The electric field may be formed by applying an alignment signal to the electrodes 210 and 220, and the shielding electrode layer 800 may block the electric field formed by the alignment signal. That is, the electric field may not be formed in the area of the electrodes 210 and 220 covered by the shielding electrode layer 800, and the electric field may be formed only in the exposed area of the electrodes 210 and 220 other than the covered area. Accordingly, in the manufacturing process of the display device 10, the light-emitting elements 300 are selectively aligned in a specific area, thereby improving the alignment of the light-emitting elements 300 disposed in the display device 10. More detailed descriptions will be given below.

The subpixel PXn of the display device 10 may include a plurality of banks 400, the plurality of electrodes 210 and 220, the plurality of light-emitting elements 300, and the shielding electrode layer 800 that does not overlap at least a partial area on the electrodes 210 and 220.

The plurality of electrodes 210 and 220 may be electrically connected to the light-emitting elements 300 and may receive a predetermined voltage such that the light-emitting elements 300 emit light. In addition, at least a portion of the electrodes 210 and 220 may be used to form an electric field in the subpixel PXn in order to align the light-emitting elements 300.

Describing the electrodes 210 and 220 in detail with reference to FIG. 1, the plurality of electrodes 210 and 220 may include a first electrode 210 and a second electrode 220. In some embodiments, the first electrode 210 may be a pixel electrode separated for each subpixel PXn, and the second electrode 220 may be a common electrode connected in common along each subpixel PXn. One of the first electrode 210 and the second electrode 220 may be an anode of the light-emitting element 300, and the other thereof may be a cathode of the light-emitting element 300. However, the present disclosure is not limited thereto, and the reverse may well be the case.

The first electrode 210 and the second electrode 220 may include electrode stem portions 210S and 220S, which are disposed to extend in a first direction D1, and one or more electrode branch portions 210B and 220B, which are branched off from the electrode stem portions 210S and 220S to extend in a second direction D2 that is a direction intersecting the first direction D1, respectively.

Specifically, the first electrode 210 may include a first electrode stem portion 210S, which is disposed to extend in the first direction D1, and one or more first electrode branch portions 2106, which are branched off from the first electrode stem portion 210S to extend in the second direction D2 (Y-axis direction).

The first electrode stem portion 210S of one pixel may be disposed on substantially the same straight line as the first electrode stem portion 210S of an adjacent pixel which belongs to the same row (for example, is adjacent thereto in the first direction D1). In other words, both ends of the first electrode stem portion 210S of one pixel may be spaced apart between the subpixels PXn and terminated between the subpixels PXn, and the first electrode stem portion 210S of an adjacent pixel may be aligned on an extension line of the first electrode stem portion 210S of the one pixel. Accordingly, the first electrode stem portion 210S disposed in each subpixel PXn may apply different electrical signals to the first electrode branch portions 210B, and each of the first electrode branch portions 2106 may be separately driven.

The first electrode branch portion 210B may be branched off from at least a portion of the first electrode stem portion 210S, may be disposed to extend in the second direction D2, and may be terminated in a state of being spaced apart from the second electrode stem portion 220S disposed opposite to the first electrode stem portion 210S.

The second electrode 220 may include a second electrode stem portion 220S, which is disposed to extend in the first direction D1 and to be spaced apart to face the first electrode stem portion 210S, and a second electrode branch portion 220B, which is branched off from the second electrode stem portion 220S and is disposed to extend in the second direction D2. However, one end of the second electrode stem portion 220S may extend to the plurality of adjacent subpixels PXn in the first direction D1. Therefore, both ends of the second electrode stem portion 220S of one pixel may be connected to the other ends of the second electrode stem portions 220S of adjacent pixels between the pixels PX.

The second electrode branch portion 220B may be disposed to be spaced apart from and face the first electrode branch portion 210B and may be terminated in a state of being spaced apart from the first electrode stem portion 210S. That is, one end of the second electrode branch portion 220B may be connected to the second electrode stem portion 220S, and the other end thereof may be disposed in the subpixel PXn in a state of being spaced apart from the first electrode stem portion 210S.

In addition, one or more first electrode branch portions 210B may be disposed in each subpixel PXn. FIG. 1 illustrates that two first electrode branch portions 210B are provided and the second electrode branch portion 220B is disposed therebetween, but the present disclosure is not limited thereto. More first electrode branch portions 210B may be provided, or one first electrode branch portion 210B may be provided and two second electrode branch portions 220B may be provided. In some embodiments, the second electrode branch portion 220B may be disposed between the first electrode branch portions 210B, and thus, each subpixel PXn may have a symmetrical structure based on the second electrode branch portion 220B. However, the present disclosure is not limited thereto.

The plurality of banks 400 may include a third bank 430 disposed at a boundary between the subpixels PXn, and a first bank 410 and a second bank 420 which are disposed below the electrodes 210 and 220, respectively. In FIG. 1, only the first electrode 210 and second electrode 220 are illustrated, and the first bank 410 and the second bank 420 are not illustrated. However, in each subpixel PXn, the first bank 410 and the second bank 420 having substantially the same shapes as the first electrode branch portion 210B and the second electrode branch portion 220B may be provided. That is, it may be understood that the first electrode branch portion 210B and the second electrode branch portion 220B are disposed on the first bank 410 and the second bank 420, respectively.

The third bank 430 may be disposed at a boundary between the first subpixel PX1 and the second subpixel PX2, and at a boundary between the second subpixel PX2 and the third subpixel PX3. Ends of a plurality of first electrode stem portions 210S may be spaced apart from each other and terminated based on the third bank 430. The third bank 430 may extend in the second direction D2 and may be disposed at the boundary between the subpixels PXn arranged in the first direction D1. However, the present disclosure is not limited thereto, and the third bank 430 may extend in the first direction D1 and may be disposed at the boundary between the subpixels PXn arranged in the second direction D2. That is, the plurality of subpixels PXn may be separated based on the third bank 430. The third bank 430 may include the same material as the first and second banks 410 and 420 and thus may be formed in substantially the same process as the first and second banks 410 and 420. The plurality of banks 400 will be described in more detail below with reference to other drawings.

Although not shown in FIG. 1, a first insulating layer 510 may be disposed in each subpixel PXn to entirely cover the subpixel PXn including the first electrode branch portion 210B and the second electrode branch portion 220B. The first insulating layer 510 may protect each of the electrodes 210 and 220 and simultaneously insulate the electrodes 210 and 220 from each other such that the electrodes 210 and 220 are not in direct contact with each other.

The shielding electrode layer 800 is disposed on the first insulating layer 510. The shielding electrode layer 800 and the electrodes 210 and 220 may not be in direct contact with each other due to the first insulating layer 510 disposed therebetween. However, as will be described below, the shielding electrode layer 800 and the electrodes 210 and 220 may be electrically connected to each other by a contact electrode 260.

The shielding electrode layer 800 may include a first shielding electrode 810 disposed on the first electrode 210 and a second shielding electrode 820 disposed on the second electrode 220. The first shielding electrode 810 and the second shielding electrode 820 may be disposed on the electrode stem portions 210S and 220S and the electrode branch portions 2106 and 220B to cover the electrode stem portions 210S and 220S and the electrode branch portions 2106 and 220B. That is, the first and second shielding electrodes 810 and 820 may also include stem portions and branch portions to form substantially the same patterns as the first and second electrodes 210 and 220.

According to some embodiments, the first shielding electrode 810 may include a first shielding electrode stem portion 810S and first shielding electrode branch portions 810B, and the second shielding electrode 820 may include a second shielding electrode stem portion 820S and a second shielding electrode branch portion 820B.

The first shielding electrode stem portion 810S and the second shielding electrode stem portion 820S may each extend in the first direction D1 and may be spaced apart from each other in the second direction D2. That is, the first and second shielding electrode stem portions 810S and 820S may have substantially the same shapes as the first and second electrode stem portions 210S and 220S, respectively. In particular, the first shielding electrode stem portion 810S may be spaced apart from the third bank 430 and terminated at a boundary of an adjacent subpixel PXn, and the second shielding electrode stem portion 820S may extend beyond the adjacent subpixel PXn.

The first shielding electrode branch portion 8106 and the second shielding electrode branch portion 820B may be branched off from the stem portions to extend in the second direction D2. The first and second shielding electrode branch portions 8106 and 820B may have substantially the same shapes as the first and second electrode branch portions 210B and 220B, respectively. That is, the first and second shielding electrode branch portions 810B and 820B may extend in the second direction D2 and may be spaced apart from each other to face each other.

Meanwhile, according to some embodiments, at least partial areas of side surfaces of the first and second shielding electrodes 810 and 820 may be recessed to form patterns. The first and second shielding electrodes 810 and 820 may include recess pattern portions 810C and 820C formed by the partial areas of the side surfaces of the first and second shielding electrodes 810 and 820 being recessed, and the electrodes 210 and 220 in areas overlapping the recess pattern portions 810C and 820C may be partially exposed. That is, the recess pattern portions 810C and 820C may be formed such that the first and second shielding electrodes 810 and 820 do not overlap at least portions of the electrodes 210 and 220.

Specifically, the recess pattern portions 810C and 820C may be formed in at least one side surfaces of the first and second shielding electrode branch portions 810B and 820B, for example, in facing side surfaces thereof. First recess pattern portions 810C may be formed in one side surface of the first shielding electrode branch portion 810B facing the second shielding electrode branch portion 820B so as to be recessed from the one side surface toward a center of the first shielding electrode branch portion 810б. Second recess pattern portions 820C may be formed in both side surfaces of the second shielding electrode branch portion 820B facing the first shielding electrode branch portions 810B so as to be recessed from the both side surfaces toward a center of the second shielding electrode branch portion 820B.

The first recess pattern portion 810C and the second recess pattern portion 820C are spaced apart from each other to face each other, and the first electrode branch portion 210B and the second electrode branch portion 220B, which respectively overlap the first recess pattern portion 810C and the second recess pattern portion 820C, may be partially exposed. The light-emitting elements 300 are aligned in such an exposed area, and both end portions of the light-emitting element 300 may be electrically connected to the first electrode branch portion 210B and the second electrode branch portion 220B. That is, an area, which is formed by the first recess pattern portion 810C and the second recess pattern portion 820C being spaced apart from each other to face each other, may be the alignment area AA.

On the other hand, in an area in which the first recess pattern portion 810C and the second recess pattern portion 820C are not formed, the first shielding electrode branch portion 810B and the second shielding electrode branch portion 820B are disposed to respectively cover the first electrode branch portion 210б and the second electrode branch portion 220B, and the light-emitting elements 300 are not aligned in an area between the first and second shielding electrode branch portions 810B and 820B and the covered first and second electrode branch portions 210B and 220B. Accordingly, the area may be the non-alignment area NAA.

However, the structure of the shielding electrode layer 800 is not limited thereto. As will be described below, the structure of the shielding electrode layer 800 is not particularly limited as long as the structure blocks an electric field formed by an alignment signal in the manufacturing process of the display device 10. This will be described in detail below with reference to other embodiments.

Meanwhile, the shielding electrode layer 800 may be a floating electrode which is insulated from the electrodes 210 and 220 in the manufacturing process of the display device 10. An alignment signal applied to the electrodes 210 and 220 so as to align the light-emitting elements 300 may not be transmitted to the shielding electrode layer 800, and the shielding electrode layer 800 may block an electric field formed by the alignment signal. When the electrodes 210 and 220 receiving the alignment signal generate the electric field, an area in which the shielding electrode layer 800 is disposed may be an area in which the electric field is blocked, and in an area other than the shielded area, the electric field may be formed, whereby the light-emitting elements 300 may be aligned therein. That is, as described above, the area in which the shielding electrode layer 800 covers the electrodes 210 and 220 may be defined as the non-alignment area NAA, and the area in which the electrodes 210 and 220 are exposed may be defined as the alignment area AA.

The shielding electrode layer 800 according to some embodiments may include substantially the same material as the electrodes 210 and 220. In some embodiments, the shielding electrode layer 800 may include at least one selected from among aluminum (Al), silver (Ag), copper (Cu), indium tin oxide (ITO), indium zinc oxide (IZO), and indium tin-zinc oxide (ITZO), and may be formed as at least one layer.

In the manufacturing process of the display device 10, the shielding electrode layer 800 may be the floating electrode which is insulated from the electrodes 210 and 220, and may perform a function of blocking an electric field. On the other hand, in the finally manufactured display device 10, the shielding electrode layer 800 may be electrically connected to the electrodes 210 and 220 through the contact electrode 260 to be described below. When the display device 10 is manufactured, the shielding electrode layer 800 may block an electric field to control the area in which the light-emitting elements 300 are aligned, and in the display device 10, the shielding electrode layer 800 may be electrically connected to the electrodes 210 and 220 to receive a driving signal.

The plurality of light-emitting elements 300 may be aligned between the first electrode branch portion 210B and the second electrode branch portion 220B. In at least some of the plurality of light-emitting elements 300, one end portion thereof may be electrically connected to the first electrode branch portion 210B, and the other end portion thereof may be electrically connected to the second electrode branch portion 220B.

The plurality of light-emitting elements 300 may be spaced apart from each other in the second direction D2 and may be aligned substantially parallel to each other. A separation distance between the light-emitting elements 300 is not particularly limited. In some cases, a plurality of light-emitting elements 300 may be disposed adjacent to each other to form a group, and a plurality of other light-emitting elements 300 may form a group in a state of being spaced apart from each other at a predetermined interval and may be oriented and aligned in one direction with non-uniform density.

According to some embodiments, the light-emitting element 300 may be disposed in an area in which the shielding electrode layer 800 does not overlap the electrodes 210 and 220, and thus, both end portions of the light-emitting element 300 may be electrically connected to the electrodes 210 and 220. Specifically, the first electrode 210 and the second electrode 220 may be partially exposed in areas thereof overlapping the first and second recess pattern portions 810C and 820C, respectively. As described above, in the exposed areas, an electric field may be formed by an alignment signal, and the light-emitting elements 300 may be aligned by the electric field. On the other hand, in an area in which the first electrode 210 and the second electrode 220 are not exposed, the electric field may not be formed, and the light-emitting elements 300 may not be aligned. Accordingly, in the manufacturing process of the display device 10, selective alignment of the light-emitting elements 300 may be induced only in a predetermined area, thereby improving the alignment of the display device 10.

The contact electrode 260 may be disposed on each of the first electrode branch portion 210B and the second electrode branch portion 220B. However, the contact electrode 260 may be substantially disposed on the first insulating layer 510 and may partially overlap the first electrode branch portion 210B and the second electrode branch portion 220B.

A plurality of contact electrodes 260 may be disposed in a shape extending in the second direction D2 and may be disposed to be spaced apart from each other in the first direction D1. The contact electrode 260 may be disposed in an area in which the first and second recessed pattern portions 810C and 820C are formed to be spaced apart from each other, and may be disconnected and patterned in an area in which the first recess pattern portion 810C and the second recess pattern portion 820C are not disposed. That is, as shown in the drawing, the contact electrode 260 disposed between the first electrode branch portion 2106 and the second electrode branch portion 220B may form patterns arranged in the second direction D2. However, the present disclosure is not limited thereto, and in some cases, the contact electrode 260 may extend in the second direction D2 and may also be formed with one pattern.

The contact electrode 260 may have a predetermined width and may be disposed on the shielding electrode branch portions 810B and 820B and the electrode branch portions 2106 and 220B to partially cover the shielding electrode branch portions 810B and 820B and the electrode branch portions 210B and 220B. The contact electrode 260 may be in contact with at least one end portion of the light-emitting element 300 and may be in contact with the first electrode 210 or the second electrode 220 to receive an electrical signal. The contact electrode 260 may also be in contact with one side portion of the shielding electrodes 810 and 820, respectively. Accordingly, the contact electrode 260 may transmit electrical signals transmitted from the electrodes 210 and 220 to the shielding electrodes 810 and 820 and the light-emitting element 300.

The contact electrode 260 may include a first contact electrode 261 and a second contact electrode 262 which are in contact with one end portion or the other end portion of the light-emitting element 300. The first contact electrode 261 may be disposed on the first electrode branch portion 2106 and may be in contact with one end portion of the light-emitting element 300 so that the one end portion may be electrically connected to the first electrode 210. The second contact electrode 262 may be disposed on the second electrode branch portion 220B and may be in contact with the other end portion of the light-emitting element 300 so that the other end portion may be electrically connected to the second electrode 220.

As shown in FIG. 1, in each subpixel PXn, two first electrode branch portions 210B may be provided, and thus, two first contact electrodes 261 may be provided. In addition, one second electrode branch portion 220B may be provided, and thus, two second contact electrodes 262 may be disposed on both side surfaces of the second electrode branch portion 220B. According to some embodiments, the first contact electrode 261 and the second contact electrode 262 may be in contact with one side surfaces of the first electrode branch portion 2106 and the second electrode branch portion 220B and simultaneously may be in contact with one side surfaces of the first shielding electrode 810 and the second shielding electrode 820, respectively.

Figure 2:
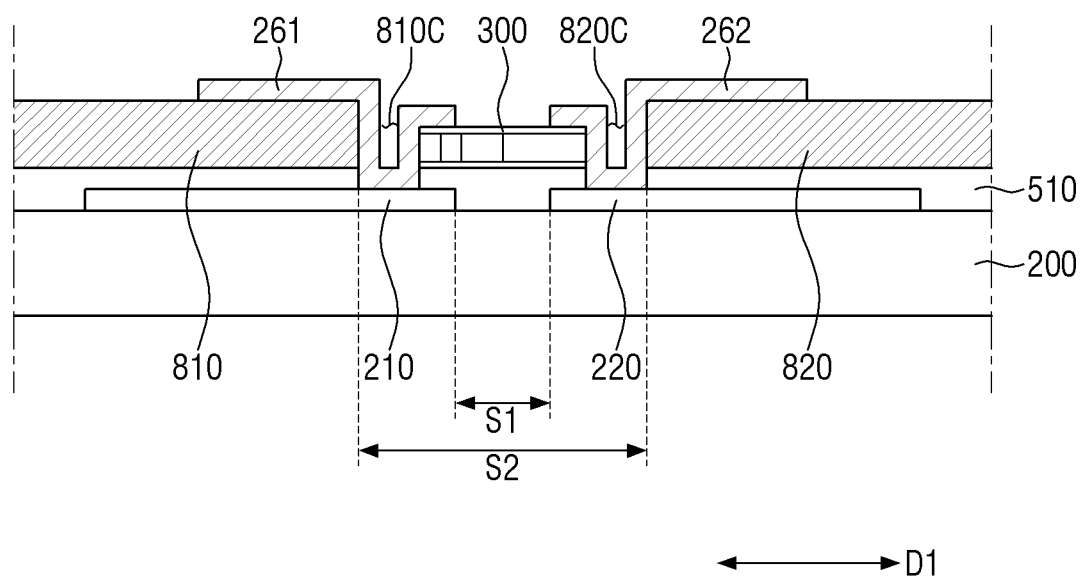
FIGS. 2 and 3 are schematic views illustrating cross sections of the display device according to some embodiments.
Figure 3:
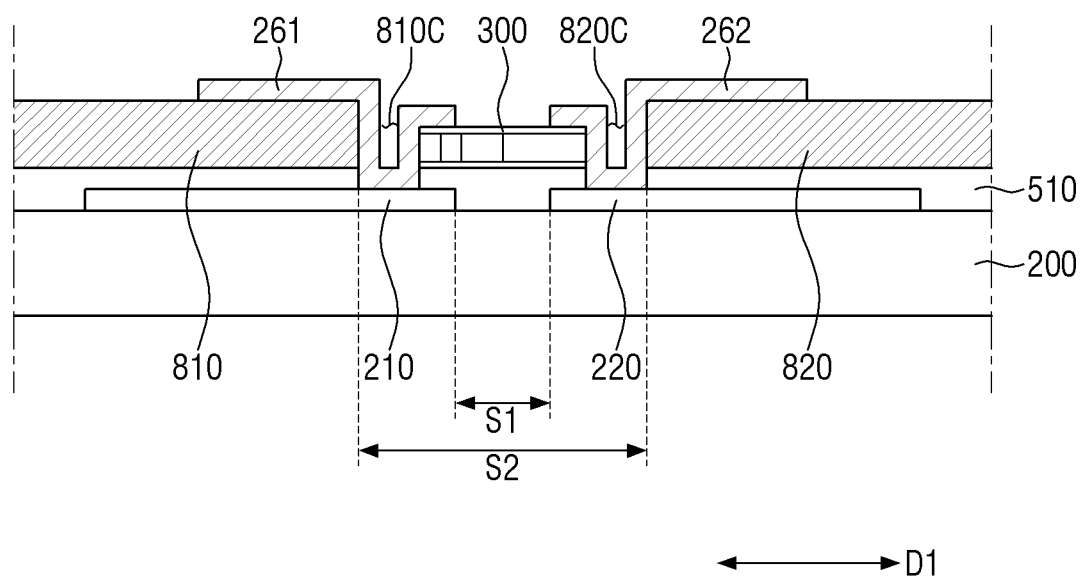

FIGS. 2 and 3 are schematic views illustrating cross sections of the display device according to some embodiments. FIG. 2 illustrates a cross section cut in (along) the first direction D1 including both ends of the light-emitting element 300 in FIG. 1, and FIG. 3 illustrates a cross section cut in (along) the second direction D2 including the recess pattern portions 810C and 820C of the shielding electrode layer 800 in FIG. 1. FIGS. 2 and 3 schematically illustrate the cross sections of the display device 10 according to some embodiments, and the structure of the display device 10 is not limited thereto.

First, referring to FIG. 2, the first electrode 210 and the second electrode 220 are disposed to be spaced apart from each other on a via layer 200 supporting the first electrode 210 and the second electrode 220. The via layer 200 will be described in detail below with reference to FIG. 4. The first insulating layer 510 may be disposed on the first electrode 210 and the second electrode 220 to partially cover the first electrode 210 and the second electrode 220, and the light-emitting element 300 may be disposed on the first insulating layer 510 disposed between the first electrode 210 and the second electrode 220. The first shielding electrode 810 and the second shielding electrode 820 may be disposed on the first insulating layer 510 disposed on the first electrode 210 and the second electrode 220.

The first shielding electrode 810 and the second shielding electrode 820 partially overlap the first electrode 210 and the second electrode 220, respectively, and areas, in which the first shielding electrode 810 and the second shielding electrode 820 do not overlap the first electrode 210 and the second electrode 220, may be areas in which the recess pattern portions 810C and 820C are positioned. The first and second contact electrodes 261 and 262 may be in contact with the first and second shielding electrodes 810 and 820, the light-emitting element 300, the first and second electrodes 210 and 220, and the first insulating layer 510. The first and second contact electrodes 261 and 262 may be in contact with the first electrode 210 and the second electrode 220 in the areas in which the recess pattern portions 810C and 820C are positioned.

According to some embodiments, the first contact electrode 261 may be in contact with one side portion of the first shielding electrode 810, and one second contact electrode 262 may be in contact with one side portion of the second shielding electrode 820. However, the present disclosure is not limited thereto, and in some cases, the first contact electrode 261 may have a wider width and may be in contact with both side portions of the first shielding electrode 810, and one second contact electrode 262 may also be in contact with both side portions of the second shielding electrode 820.

Meanwhile, the shielding electrode layer 800 may include the recess pattern portions 810C and 820C, and thus, a separation distance between the first shielding electrode 810 and the second shielding electrode 820 may be different from a separation distance between the first electrode 210 and the second electrode 220. In the display device 10 according to some embodiments, a distance between the shielding electrodes 810 and 820 measured in one direction across both ends of the light-emitting element 300 may be greater than a distance between the electrodes 210 and 220 measured in the one direction.

Specifically, as shown in FIGS. 1 and 2, in the alignment area AA in which the light-emitting element 300 is disposed, the first electrode 210 and the first shielding electrode 810 may be spaced apart from the second electrode 220 and the second shielding electrode 820 in the first direction D1 across both ends of the light-emitting element 300, respectively. A distance S1 between the electrodes 210 and 220 measured in the first direction D1 may be less than a distance S2 between the shielding electrodes 810 and 820 measured in the first direction D1.

The first shielding electrode 810 and the second shielding electrode 820 form substantially the same patterns as the first electrode 210 and the second electrode 220, respectively, and because the first recess pattern portion 810C and the second recess pattern portion 820C are formed, one side surfaces of the first shielding electrode 810 and the second shielding electrode 820 may be formed to be recessed. In particular, in the alignment area AA in which the recess pattern portions 810C and 820C are formed, the separation distance S1 between the electrodes 210 and 220 may be less than the separation distance S2 between the shielding electrodes 810 and 820.

Accordingly, one side surfaces of the electrodes 210 and 220 may be disposed to protrude from one side surfaces of the shielding electrodes 810 and 820, for example, one side surfaces facing the light-emitting element 300. The shielding electrodes 810 and 820 may not be disposed on the first insulating layer 510 overlapping such protruding areas, and the first insulating layer 510 may be exposed in the protruding areas. In the manufacturing process of the display device 10, in areas in which the electrodes 210 and 220 protrude, and thus the first insulating layer 510 is exposed, an electric field is formed so that the light-emitting elements 300 may be aligned.

According to some embodiments, in the alignment area AA, the separation distance S1 between the electrodes 210 and 220 may be less than a distance between both ends of the light-emitting element 300, that is, a length h (shown in FIG. 6), measured in one direction, and the separation distance S2 between the shielding electrodes 810 and 820 may be greater than the length h (shown in FIG. 6) of the light-emitting element 300.

Because the light-emitting element 300 has the length h that is greater than the distance S1 between the first electrode 210 and the second electrode 220, the light-emitting element 300 may be disposed between the first electrode 210 and the second electrode 220 so that both end portions of the light-emitting element 300 may be connected to the first electrode 210 and the second electrode 220. In addition, because the light-emitting element 300 has the length h (shown in FIG. 6) that is less than the distance S2 between the first shielding electrode 810 and the second shielding electrode 820, the light-emitting element 300 may be aligned to be spaced apart from the shielding electrodes 810 and 820 on the electrodes 210 and 220 not overlapping the shielding electrodes 810 and 820.

However, the present disclosure is not limited thereto, and in an area in which the recess pattern portions 810C and 820C of the shielding electrodes 810 and 820 are not formed, a separation distance between the shielding electrodes 810 and 820 may be less than or equal to a separation distance between the electrodes 210 and 220.

Referring to FIG. 3, in a cross section of an area, in which the first electrode 210 and the first shielding electrode 810 are disposed, in the second direction D2, the first shielding electrodes 810 may form patterns to be arranged in the second direction D2, and the plurality of light-emitting elements 300 may be disposed between the first shielding electrodes 810 which are spaced from each other. An area in which the first shielding electrodes 810 are disposed may be understood as an area in which an electric field is not formed in the manufacturing process of the display device 10, and an area in which the first shielding electrodes 810 are spaced from each other, that is, an area in which the first recess pattern portion 810C is formed may be understood as an area in which an electric field is formed. Because the first shielding electrode 810 is formed, the light-emitting elements 300 may be aligned only in the area in which the first recess pattern portion 810C is positioned, and it is possible to reduce the number of light-emitting elements 300 aligned at unnecessary positions.

Meanwhile, the first electrode stem portion 210S and the second electrode stem portion 220S may be electrically connected to a first transistor 120 or a power line 161, to be described below, through contact holes, for example, a first electrode contact hole CNTD and a second electrode contact hole CNTS, respectively. In the drawing, one second electrode contact hole CNTS is illustrated as being formed in the second electrode stem portion 220S of the plurality of subpixels PXn. However, the present disclosure is not limited thereto, and in some cases, the second electrode contact hole CNTS may be formed for each subpixel PXn.

In addition, although not shown in FIG. 1, the display device 10 may include a second insulating layer 520 (shown in FIG. 4) and a passivation layer 550 (shown in FIG. 4) which are disposed to cover each of the electrodes 210 and 220 and at least a portion of the light-emitting element 300. The arrangement and structure therebetween will be described below with reference to FIG. 4.

The display device 10 may further include a circuit element layer positioned below each of the electrodes 210 and 220 shown in FIG. 1. Hereinafter, this will be described in detail with reference to other drawings.

Figure 4:
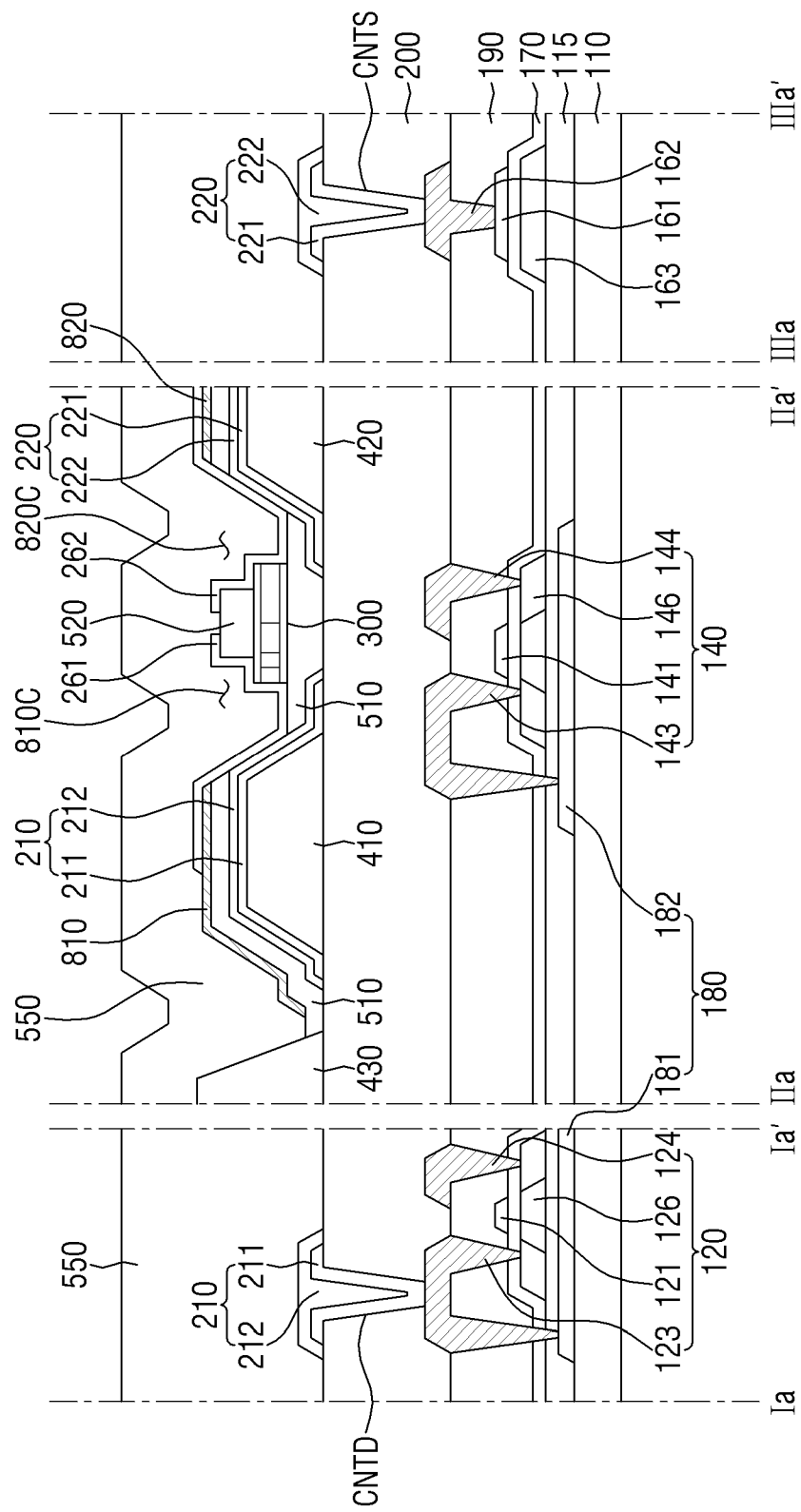
FIG. 4 is a cross-sectional view taken along lines Ia-Ia', IIa-IIa', and IIIa-IIIa' of FIG. 1.
Figure 5:
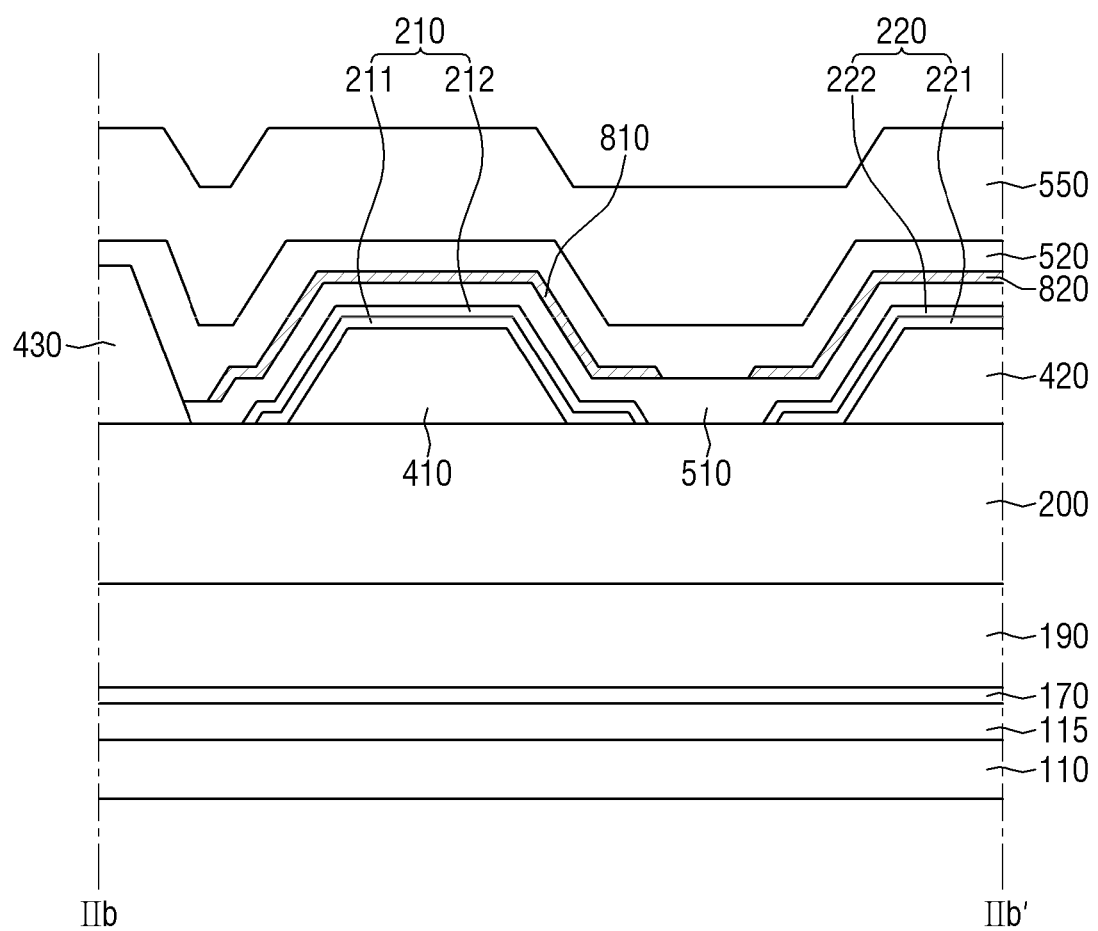
FIG. 5 is a cross-sectional view taken along line IIb-IIb' of FIG. 1.

FIG. 4 is a cross-sectional view taken along lines Ia-Ia', IIa-IIa', and IIIa-IIIa' of FIG. 1. FIG. 5 is a cross-sectional view taken along line IIb-IIb' of FIG. 1. FIGS. 4 and 5 illustrate only the first subpixel PX1, but the same may be applied to other pixels PX or subpixels PXn. FIG. 4 illustrates a cross section traversing one end and the other end of a light-emitting element 300.

Referring to FIGS. 1 and 4, the display device 10 may include a substrate 110, a buffer layer 115, first and second bridge patterns 181 and 182, first and second transistors 120 and 140, the electrodes 210 and 220 disposed on the first and second transistors 120 and 140, and the light-emitting element 300.

Specifically, the substrate 110 may be an insulating substrate. The substrate 110 may be made of an insulating material such as glass, quartz, or a polymer resin. In addition, the substrate 110 may be a rigid substrate or a flexible substrate which is bendable, foldable, and rollable.

The first and second bridge patterns 181 and 182 may be disposed on the substrate 110. The first bridge pattern 181 may be electrically connected to a first drain electrode 123 of the first transistor 120 to be described below. The second bridge pattern 182 may be electrically connected to a second drain electrode 143 of the second transistor 140.

The first bridge pattern 181 and the second bridge pattern 182 are disposed to overlap a first active material layer 126 of the first transistor 120 and a second active material layer 146 of the second transistor 140, respectively. The first and second bridge patterns 181 and 182 may include a light-blocking material to prevent light from being incident on the first and second active material layers 126 and 146. As an example, the first and second bridge patterns 181 and 182 may be made of an opaque metallic material that blocks light transmission.

The buffer layer 115 is disposed on the first and second bridge patterns 181 and 182 and the substrate 110. The buffer layer 115 may be disposed to entirely cover the substrate 110 including the first and second bridge patterns 181 and 182.

The buffer layer 115 may prevent the diffusion of impurity ions, prevent the permeation of moisture or ambient air, and perform a surface planarization function. In addition, the buffer layer 115 may insulate the first and second bridge patterns 181 and 182 from the first and second active material layers 126 and 146.

A semiconductor layer is disposed on the buffer layer 115. The semiconductor layer may include the first active material layer 126 of the first transistor 120, the second active material layer 146 of the second transistor 140, and an auxiliary material layer 163. The semiconductor layer may include polycrystalline silicon, single crystal silicon, an oxide semiconductor, or the like.

A first gate insulating film 170 is disposed on the semiconductor layer. The first gate insulating film 170 may be disposed to entirely cover the buffer layer 115 including the semiconductor layer. The first gate insulating film 170 may serve as gate insulating films of the first and second transistors 120 and 140.

A first conductive layer is disposed on the first gate insulating film 170. On the first gate insulating film 170, the first conductive layer may include a first gate electrode 121 disposed on the first active material layer 126 of the first transistor 120, a second gate electrode 141 disposed on the second active material layer 146 of the second transistor 140, and the power line 161 disposed on the auxiliary material layer 163.

An interlayer insulating film 190 is disposed on the first conductive layer. The interlayer insulating film 190 may perform a function of an interlayer insulating film. In addition, the interlayer insulating film 190 may include an organic insulating material and may perform a surface planarization function.

A second conductive layer is disposed on the interlayer insulating film 190. The second conductive layer includes the first drain electrode 123 and a first source electrode 124 of the first transistor 120, the second drain electrode 143 and a second source electrode 144 of the second transistor 140, and a power electrode 162 disposed on the power line 161.

The first drain electrode 123 and the first source electrode 124 may be electrically connected to the first active material layer 126 through contact holes passing through the interlayer insulating film 190 and the first gate insulating film 170. The second drain electrode 143 and the second source electrode 144 may be electrically connected to the second active material layer 146 through contact holes passing through the interlayer insulating film 190 and the first gate insulating film 170. In addition, the first drain electrode 123 and the second drain electrode 143 may be electrically connected to the first bridge pattern 181 and the second bridge pattern 182, respectively, through other contact holes, respectively.

The via layer 200 is disposed on the second conductive layer. The via layer 200 may include an organic insulating material to perform a surface planarization function.

The plurality of banks 410, 420, and 430 are disposed on the via layer 200. The plurality of banks 410, 420, and 430 may be disposed to be spaced apart from each other in each subpixel PXn. The plurality of banks 410, 420, and 430 may include the first and second banks 410 and 420 disposed adjacent to a central portion of the subpixel PXn, and the third bank 430 at the boundary between the subpixels PXn.

The third bank 430 may be a bank that distinguishes a boundary of each subpixel PXn. When the display device 10 is manufactured, the third bank 430 may perform a function of blocking an organic material or a solvent from crossing the boundary of the subpixel PXn when the organic material or the solvent is sprayed using an inkjet printing method. Alternatively, when the display device 10 further includes another member, the member may be disposed on the third bank 430, and the third bank 430 may also perform a function of supporting the member. However, the present disclosure is not limited thereto.

The first bank 410 and the second bank 420 are disposed to be spaced apart and face each other. The first electrode 210 may be disposed on the first bank 410, and the second electrode 220 may be disposed on the second bank 420. Referring to FIGS. 1 and 4, it may be understood that the first electrode branch portion 210B is disposed on the first bank 410, and the second electrode branch portion 220B is disposed on the second bank 420. That is, the first bank 410 and the second bank 420 may extend in the second direction D2 and may be disposed to be spaced apart from each other in the first direction D1 based on FIG. 1

FIG. 4 illustrates that one first bank 410, one second bank 420, and one third bank 430 are disposed, but the present disclosure is not limited thereto. When two first electrode branch portions 210B are disposed in one subpixel PXn as shown in FIG. 1, two first banks 410 and one second bank 420 may be provided, and each subpixel PXn may include more banks 410, 420, and 430.

As described above, the first bank 410, the second bank 420, and the third bank 430 may be formed in substantially the same process. Accordingly, the banks 410, 420, and 430 may form one grid pattern. The plurality of banks 410, 420, and 430 may include polyimide (PI).

The plurality of banks 410, 420, and 430 may have a structure in which at least a portion thereof protrudes from the via layer 200. The banks 410, 420, and 430 may protrude upward from a planar surface on which the light-emitting element 300 is disposed, and at least a portion of such a protruding portion may have an inclination. The shape of the banks 410, 420, and 430 having the protruding structure is not particularly limited. As shown in the drawing, the first bank 410 and the second bank 420 may protrude to the same height, and the third bank 430 may have a shape protruding to a higher position.

Reflective layers 211 and 221 may be disposed on the first and second banks 410 and 420, and electrode layers 212 and 222 may be disposed on the reflective layers 211 and 221. The reflective layers 211 and 221 and the electrode layers 212 and 222 may constitute the electrodes 210 and 220.

The reflective layers 211 and 221 include a first reflective layer 211 and a second reflective layer 221. The first reflective layer 211 covers the first bank 410, and a portion thereof is electrically connected to the first drain electrode 123 through a contact hole passing through the via layer 200. The second reflective layer 221 covers the second bank 420, and a portion thereof is electrically connected to the power electrode 162 through a contact hole passing through the via layer 200. The contact hole through which the first reflective layer 211 is connected may be the first electrode contact hole CNTD of FIG. 1, and the contact hole through which the second reflective layer 221 is connected may be the second electrode contact hole CNTS of FIG. 1.

The reflective layers 211 and 221 may include a material having high reflectance to reflect emission light EL emitted from the light-emitting element 300. As an example, the reflective layers 211 and 221 may include a material such as silver (Ag), copper (Cu), ITO, IZO, or ITZO, but the present disclosure is not limited thereto.

The electrode layers 212 and 222 include a first electrode layer 212 and a second electrode layer 222. The electrode layers 212 and 222 may have substantially the same patterns as the reflective layers 211 and 221. The first reflective layer 211 and the first electrode layer 212 are disposed to be spaced apart from the second reflective layer 221 and the second electrode layer 222.

The electrode layers 212 and 222 may include a transparent conductive material so that the emission light EL emitted from the light-emitting element 300 may be incident on the reflective layers 211 and 221. As an example, the electrode layers 212 and 222 may include a material such as ITO, IZO, or ITZO, but the present disclosure is not limited thereto.

In some embodiments, the reflective layers 211 and 221 and the electrode layers 212 and 222 may have a structure in which at least one transparent conductive layer made of ITO, IZO, or ITZO and at least one metal layer made of silver or copper are stacked. As an example, the reflective layers 211 and 221 and the electrode layers 212 and 222 may have a stacked structure of ITO/Ag/ITO/IZO.

The first reflective layer 211 and the first electrode layer 212 may constitute the first electrode 210, and the second reflective layer 221 and the second electrode layer 222 may constitute the second electrode 220. The first electrode 210 and the second electrode 220 transmit electrical signals transmitted from the first transistor 120 and the power electrode 162 to the light-emitting element 300 through the first electrode layer 212 and the second electrode layer 222, respectively.

Meanwhile, in some embodiments, the first electrode 210 and the second electrode 220 may be formed as one layer. That is, the reflective layers 211 and 221 and the electrode layers 212 and 222 are formed as one single-layer to transmit an electrical signal to the light-emitting element 300 and simultaneously reflect the emission light EL. In some embodiments, the first electrode 210 and the second electrode 220 may include a conductive material having high reflectance. As an example, the first electrode 210 and the second electrode 220 may be made of an alloy including aluminum (Al), nickel (Ni), lanthanum (La), or the like. However, the present disclosure is not limited thereto.

The first insulating layer 510 is disposed on the first electrode 210 and the second electrode 220 to partially cover the first electrode 210 and the second electrode 220. The first insulating layer 510 may be disposed to cover most of upper surfaces of the first electrode 210 and the second electrode 220, and may expose portions of the first electrode 210 and the second electrode 220. The first insulating layer 510 may be disposed to cover a separation space between the first electrode 210 and the second electrode 220, and also partially cover an area opposite to the space between the first electrode 210 and the second electrode 220.

The first insulating layer 510 is disposed such that the relatively flat upper surfaces of the first electrode 210 and the second electrode 220 are exposed, and may be disposed such that the electrodes 210 and 220 overlap inclined side surfaces of the first bank 410 and the second bank 420. The first insulating layer 510 has a flat upper surface formed such that the light-emitting element 300 is disposed thereon, and the upper surface extends in one direction toward each of the first electrode 210 and the second electrode 220. Such extended portions of the first insulating layer 510 are terminated at inclined side surfaces of the first electrode 210 and the second electrode 220. Accordingly, the contact electrode 260 to be described below may be in contact with the exposed first and second electrodes 210 and 220, and may be in smooth contact with the light-emitting element 300 on the flat upper surface of the first insulating layer 510.

The first insulating layer 510 may protect the first electrode 210 and the second electrode 220 and simultaneously insulate the first electrode 210 and the second electrode 220 from each other. The first insulating layer 510 may also prevent the light-emitting element 300 disposed on the first insulating layer 510 from being damaged by direct contact with other members. In addition, the first insulating layer 510 may perform a function of insulating the first electrode 210 and the second electrode 220 from the shielding electrode layer 800 in the manufacturing process of the display device 10. As described above, because the shielding electrode layer 800 is insulated from the electrodes 210 and 220, an electric field by an alignment signal may not be formed in areas in which the shielding electrode layer 800 overlaps the electrodes 210 and 220. The first insulating layer 510 may be disposed between the shielding electrode layer 800 and the electrodes 210 and 220 to insulate the shielding electrode layer 800 from the electrodes 210 and 220.

The light-emitting element 300 or the shielding electrode layer 800 is disposed on the first insulating layer 510.

One or more light-emitting elements 300 may be disposed on the first insulating layer 510 between the first electrode 210 and the second electrode 220. In the light-emitting element 300, a plurality of layers may be disposed in a horizontal direction on the via layer 200. As will be described below, the light-emitting element 300 may include a first conductivity-type semiconductor 310, an active layer 330, a second conductivity-type semiconductor 320, and an electrode material layer 370. In the light-emitting element 300 according to some embodiments, the plurality of layers may be sequentially disposed in the horizontal direction on the via layer 200. However, the present disclosure is not limited thereto, and the sequence, in which the plurality of layers of the light-emitting element 300 are disposed, may be reversed. In addition, in some cases, when the light-emitting element 300 has another structure, the plurality of layers may be disposed in a direction perpendicular to the via layer 200. This will be described below with reference to other drawings.

The shielding electrode layer 800 may be disposed to partially overlap the first insulating layer 510 disposed on the first electrode 210 and the second electrode 220. As shown in FIG. 4, the shielding electrode layer 800 may be disposed on the upper surfaces of the first electrode 210 and the second electrode 220, and may extend along the first insulating layer 510 in a direction opposite to (e.g., away from) the light-emitting element 300. Here, areas in which the electrodes 210 and 220 are exposed between the shielding electrode layer 800 and the light-emitting element 300 may be areas in which the above-described recess pattern portions 810C and 820C are positioned.

The first shielding electrode 810 may be disposed on the first electrode 210, and the second shielding electrode 820 may be disposed on the second electrode 220. A space between facing side portions of the first shielding electrode 810 and the second shielding electrode 820, which is an area in which the light-emitting element 300 is disposed, may be an area in which the first recess pattern portion 810C and the second recess pattern portion 820C are positioned.

In the manufacturing process of the display device 10, in the areas in which the first and second recessed pattern portions 810C and 820C are positioned, the first electrode 210 and the second electrode 220 are exposed, and thus, an electric field may be formed. On the other hand, as shown in FIG. 5, the electric field is not formed in the areas in which the first electrode 210 and the second electrode 220 overlap the shielding electrode layer 800.

FIG. 4 is a cross-sectional view including the alignment area AA in which the recess pattern portions 810C and 820C are positioned, and FIG. 5 is a cross-sectional view including the non-alignment area NAA in which the recess pattern portions 810C and 820C are not positioned.

Referring to FIG. 5, the first insulating layer 510 may be disposed to cover entire areas of the first electrode 210 and the second electrode 220, the first shielding electrode 810 may be disposed to cover the first electrode 210, and the second shielding electrode 820 may be disposed to cover the second electrode 220. That is, the first and second shielding electrodes 810 and 820 may be partially disposed in an area between the first electrode 210 and the second electrode 220. Because the first and second shielding electrodes 810 and 820 of FIG. 5 are disposed to entirely cover the first electrode 210 and the second electrode 220, in the manufacturing process of the display device 10, an electric field may not be formed between the first electrode 210 and the second electrode 220. Even when an alignment signal is applied to the first electrode 210 and the second electrode 220, the formation of an electric field may be blocked by the first and second shielding electrodes 810 and 820 insulated by the first insulating layer 510. The shielding electrode layer 800 may guide the light-emitting elements 300 to be aligned only in the area in which the recess pattern portions 810C and 820C are formed. When the light-emitting elements 300 are aligned only in a specific area, it is possible to minimize the misalignment of the light-emitting elements 300 occurring in the manufacturing process of the display device 10 or minimize the number of the light-emitting elements 300 aligned in unnecessary areas. Accordingly, in the display device 10 including the shielding electrode layer 800, it is possible to improve the alignment of the light-emitting elements 300.

Meanwhile, the arrangement or structure of the shielding electrode layer 800 is not limited to the structures shown in FIGS. 1, 4, and 5. In some cases, the shielding electrode layer 800 may be patterned to not be disposed in the alignment area AA of the light-emitting element 300. For detailed descriptions thereof, reference is made to other embodiments.

Referring again to FIG. 4, the second insulating layer 520 may be disposed on the light-emitting element 300. The second insulating layer 520 may perform functions of protecting and fixing the light-emitting element 300 at the same time. The second insulating layer 520 may be disposed to surround an outer surface of the light-emitting element 300. In some embodiments, a portion of a material of the second insulating layer 520 may be disposed between a lower surface of the light-emitting element 300 and the first insulating layer 510. The second insulating layer 520 may extend in the second direction D2 between the first electrode branch portion 210B and the second electrode branch portion 220B to have an island shape or a linear shape in a plan view.

The second insulating layer 520 is disposed to expose both side surfaces of the light-emitting element 300. Therefore, the contact electrode 260 may be in smooth contact with the side surfaces of both end portions of the light-emitting element 300. However, the present disclosure is not limited thereto, and the second insulating layer 520 may be aligned with both ends of the light-emitting element 300.

The contact electrode 260 is disposed on each of the electrodes 210 and 220, the second insulating layer 520, and the shielding electrode layer 800. The contact electrode 260 includes the first contact electrode 261 disposed on the first electrode 210 and the first shielding electrode 810, and the second contact electrode 262 disposed on the second electrode 220 and the second shielding electrode 820. The first contact electrode 261 and the second contact electrode 262 are disposed to be spaced apart from each other on the second insulating layer 520. Accordingly, the second insulating layer 520 may insulate the first contact electrode 261 and the second contact electrode 262 from each other.

The first contact electrode 261 may be in contact with the first shielding electrode 810, the first electrode 210 exposed by patterning the first insulating layer 510, the first insulating layer 510, the light-emitting element 300, and the second insulating layer 520. The second contact electrode 262 may be in contact with the second shielding electrode 820, the second electrode 220 exposed by patterning the first insulating layer 510, the first insulating layer 510, the light-emitting element 300, and the second insulating layer 520. The first contact electrode 261 and the second contact electrode 262 may be in contact with the side surfaces of both end portions of the light-emitting element 300, for example, the first conductivity-type semiconductor 310, and the second conductivity-type semiconductor 320 or the electrode material layer 370, respectively. As described above, the first insulating layer 510 may be formed to have the flat upper surface so that the contact electrode 260 may be in smooth contact with the side surfaces of the light-emitting element 300.

In addition, in the manufacturing process of the display device 10, the first shielding electrode 810 and the second shielding electrode 820 disposed in a floating state may be in contact with the first contact electrode 261 and the second contact electrode 262, respectively. Accordingly, signals applied from the first electrode 210 and the second electrode 220 may be transmitted. However, the present disclosure is not limited thereto, and the shielding electrode layer 800 may maintain a floating state in the display device 10 according to the arrangement thereof.

The contact electrode 260 may include a conductive material. For example, the contact electrode 260 may include ITO, IZO, ITZO, aluminum (Al), or the like. However, the present disclosure is not limited thereto.

The passivation layer 550 may be formed on the shielding electrode layer 800, the second insulating layer 520, and the contact electrode 260, and may serve to protect members disposed on the via layer 200 from an external environment.

Each of the first insulating layer 510, the second insulating layer 520, and the passivation layer 550 may include an inorganic insulating material or an organic insulating material. In some embodiments, the first insulating layer 510 and the passivation layer 550 may include a material such as silicon oxide ($SiO_x$), silicon nitride ($SiN_x$), silicon oxynitride ($SiO_xN_y$), aluminum oxide ($Al_2O_3$), or aluminum nitride (AlN). The second insulating layer 520 may include a photoresist or the like as an organic insulating material. However, the present disclosure is not limited thereto.

Meanwhile, the light-emitting element 300 may include a semiconductor crystal doped with arbitrary (e.g., suitable) conductivity-type (for example, p-type or n-type) impurities. The semiconductor crystal may receive an electrical signal applied from an external power source and emit light having a specific wavelength in response to the received electrical signal.

The light-emitting element 300 may be a light-emitting diode, and specifically, the light-emitting element 300 may be an inorganic light-emitting diode which has a size of a micrometer or nanometer unit and is made of an inorganic material. When the light-emitting element 300 is the inorganic light-emitting diode, and when an electric field is formed between two facing electrodes in a specific direction, the inorganic light-emitting diode may be aligned between the two electrodes in which a polarity is formed therebetween. Therefore, by forming an electric field, the light-emitting element 300 having a micro-size may be aligned on electrodes of the display device 10. The light-emitting elements 300 may receive a predetermined electrical signal from the electrodes to emit light having a specific wavelength.

Figure 6:
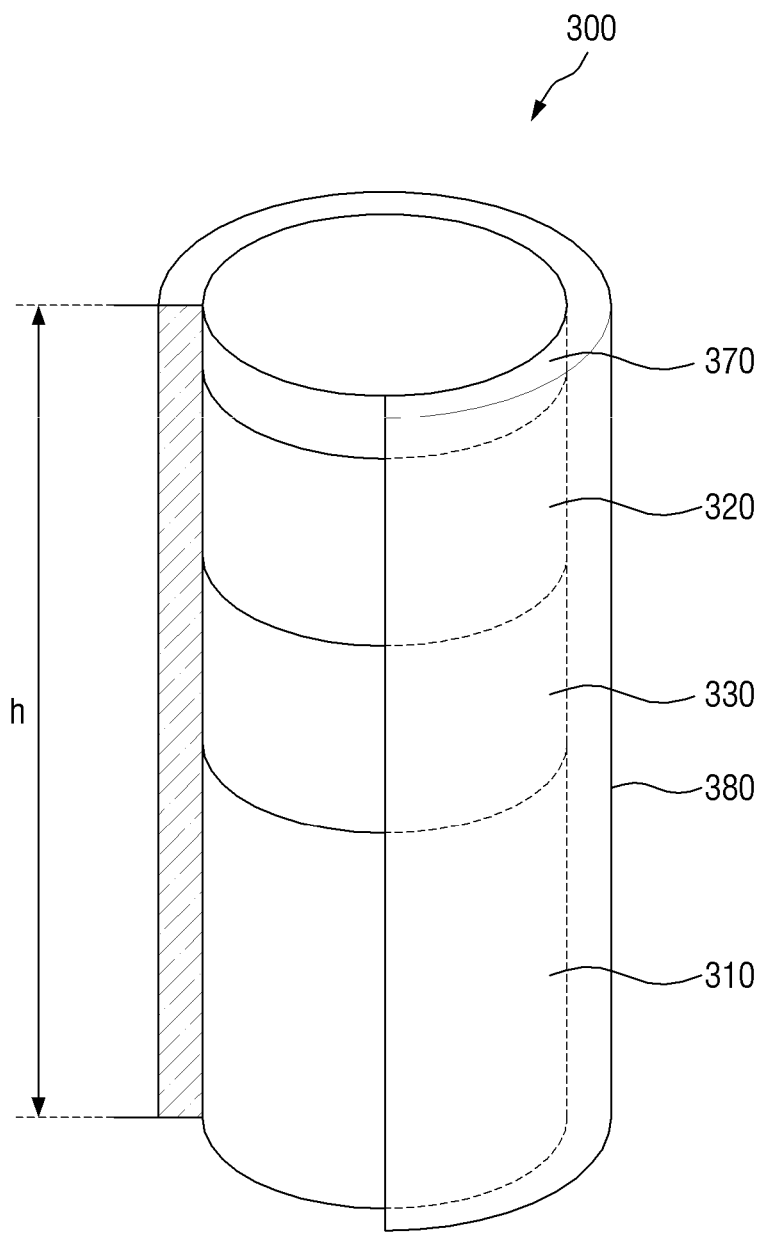
FIG. 6 is a schematic diagram of a light-emitting element according to some embodiments.

FIG. 6 is a schematic diagram of a light-emitting element according to some embodiments.

Referring to FIG. 6, a light-emitting element 300 according to some embodiments may include a plurality of conductivity-type semiconductors 310 and 320, an active layer 330, an electrode material layer 370, and an insulating film 380. The plurality of conductivity-type semiconductors 310 and 320 may transmit electrical signals transmitted to the light-emitting element 300 to the active layer 330, and the active layer 330 may emit light having a specific wavelength.

Specifically, the light-emitting element 300 may include a first conductivity-type semiconductor 310, a second conductivity-type semiconductor 320, the active layer 330 disposed between the first conductivity-type semiconductor 310 and the second conductivity-type semiconductor 320, the electrode material layer 370 disposed on the second conductivity-type semiconductor 320, and the insulating film 380 disposed to surround outer surfaces of the first and second conductivity-type semiconductors 310 and 320, the active layer 330, and the electrode material layer 370. In FIG. 6, the light-emitting element 300 is illustrated as having a structure in which the first conductivity-type semiconductor 310, the active layer 330, the second conductivity-type semiconductor 320, and the electrode material layer 370 are sequentially formed in a length direction thereof, but the present disclosure is not limited thereto. The electrode material layer 370 may be omitted, and in some embodiments, the electrode material layer 370 may also be disposed on at least one of both side surfaces of the first conductivity-type semiconductor 310 and the second conductivity-type semiconductor 320. The same description may be applied to the light-emitting element 300 to be described below, even when the light-emitting element 300 further includes another structure.

The first conductivity-type semiconductor 310 may be an n-type semiconductor layer. As an example, when the light-emitting element 300 emits light having a blue wavelength, the first conductivity-type semiconductor 310 may be made of a semiconductor material having a formula of $In_xAl_yGa_{1-x-y}N$ ($0 \leq x \leq 1$, $0 \leq y \leq 1$, and $0 \leq x+y \leq 1$). For example, the first conductivity-type semiconductor 310 may be made of at least one selected from among InAlGaN, GaN, AlGaN, InGaN, AlN, and InN, which are n-type doped. The first conductivity-type semiconductor 310 may be doped with a first conductivity-type dopant. As an example, the first conductivity-type dopant may be silicon (Si), germanium (Ge), tin (Sn), or the like. The first conductivity-type semiconductor 310 may have a length ranging from 1.5 μm to 5 μm, but the present disclosure is not limited thereto.

The second conductivity-type semiconductor 320 may be a p-type semiconductor layer. As an example, when the light-emitting element 300 emits light having a blue wavelength, the second conductivity-type semiconductor 320 may be made of a semiconductor material having a formula of $In_xAl_yGa_{1-x-y}N$ ($0 \leq x \leq 1$, $0 \leq y \leq 1$, and $0 \leq x+y \leq 1$). For example, the second conductivity-type semiconductor 320 may be made of at least one selected from among InAlGaN, GaN, AlGaN, InGaN, AlN, and InN, which are p-type doped. The second conductivity-type semiconductor 320 may be doped with a second conductivity-type dopant. As an example, the second conductivity-type dopant may be magnesium (Mg), zinc (Zn), calcium (Ca), selenium (Se), barium (Ba), or the like. The second conductivity-type semiconductor 320 may have a length ranging from 0.08 μm to 0.25 μm, but the present disclosure is not limited thereto.

Meanwhile, in the drawing, each of the first conductivity-type semiconductor 310 and the second conductivity-type semiconductor 320 is illustrated as being consisting of one layer, but the present disclosure is not limited thereto. In some cases, the first conductivity-type semiconductor 310 and the second conductivity-type semiconductor 320 may include more layers according to a material of the active layer 330 to be described below.

The active layer 330 may be disposed between the first conductivity-type semiconductor 310 and the second conductivity-type semiconductor 320, and may include a material having a single or multi-quantum well structure. When the active layer 330 includes a material having a multi-quantum well structure, the active layer 330 may have a structure in which a plurality of quantum layers and a plurality of well layers are alternately stacked. The active layer 330 may emit light due to electron-hole pair combination according to an electrical signal applied through the first conductivity-type semiconductor 310 and the second conductivity-type semiconductor 320. As an example, when the active layer 330 emits light having a blue wavelength, the active layer 330 may include a material such as AlGaN or AlInGaN. In particular, when the active layer 330 has a structure in which quantum layers and well layers are alternately stacked in a multi-quantum well structure, the quantum layer may include a material such as AlGaN or AlInGaN, and the well layer may include a material such as GaN or AlGaN.

However, the present disclosure is not limited thereto, and the active layer 330 may have a structure in which a semiconductor material having high band gap energy and a semiconductor material having low band gap energy are alternately stacked, or may include other Group III or V semiconductor materials according to a wavelength of emitted light. Accordingly, light emitted by the active layer 330 is not limited to light having a blue wavelength, and in some cases, the active layer 330 may emit light having a red or green wavelength. The active layer 330 may have a length ranging from 0.05 μm to 0.25 μm, but the present disclosure is not limited thereto.

Meanwhile, light emitted from the active layer 330 may be emitted not only to an outer surface of the light-emitting element 300 in the length direction thereof but also to both side surfaces of the light-emitting element 300. The directionality of the light emitted from the active layer 330 is not limited to one direction.

The electrode material layer 370 may be an ohmic contact electrode. However, the present disclosure is not limited thereto, and the electrode material layer 370 may be a Schottky contact electrode. The electrode material layer 370 may include a conductive metal. For example, the electrode material layer 370 may include at least one selected from among aluminum (Al), titanium (Ti), indium (In), gold (Au), silver (Ag), ITO, IZO, and ITZO. The electrode material layer 370 may include the same material or different materials, but the present disclosure is not limited thereto.

The insulating film 380 may be formed to be in contact with and surround the outer surfaces of the first conductivity-type semiconductor 310, the second conductivity-type semiconductor 320, the active layer 330, and the electrode material layer 370. The insulating film 380 may perform a function of protecting such members. As an example, the insulating film 380 may be formed to surround side surfaces of the members and may be formed to expose both end portions of the light-emitting element 300 in the length direction thereof. However, the present disclosure is not limited thereto.

The insulating film 380 may include at least one selected from among materials having insulating properties, for example, silicon oxide ($SiO_x$), silicon nitride ($SiN_x$), silicon oxynitride ($SiO_xN_y$), aluminum nitride (AlN), and aluminum oxide ($Al_2O_3$). Accordingly, it is possible to prevent an electrical short circuit that may occur when the active layer 330 is in direct contact with an electrode through which an electrical signal is transmitted to the light-emitting element 300. In addition, because the insulating film 380 protects the outer surface of the light-emitting element 300 including the active layer 330, it is possible to prevent a decrease in luminous efficiency.

In the drawing, the insulating film 380 is illustrated as being formed to extend in the length direction of the light-emitting element 300 and to cover the first conductivity-type semiconductor 310 to the electrode material layer 370, but the present disclosure is not limited thereto. The insulating film 380 may cover only the first conductivity-type semiconductor 310, active layer 330, and second conductivity-type semiconductor 320, or may cover a portion of the outer surface of the electrode material layer 370 so that a portion of the outer surface of the electrode material layer 370 may be exposed.

The insulating film 380 may have a thickness ranging from 0.5 μm to 1.5 μm, but the present disclosure is not limited thereto.

In addition, in some embodiments, an outer surface of the insulating film 380 may be surface-treated. When the display device 10 is manufactured, the light-emitting element 300 may be aligned by being sprayed on electrodes in a state of being dispersed in a predetermined ink. Here, in order for the light-emitting element 300 to remain dispersed without being aggregated with other adjacent light-emitting elements 300 in the ink, the surface of the insulating film 380 may be hydrophobic- or hydrophilic-treated.

The light-emitting element 300 may have a shape extending in one direction. The light-emitting element 300 may have a shape such as a nanorod, nanowire, or nanotube. In some embodiments, the light-emitting element 300 may have a cylindrical shape or a rod-like shape. However, the shape of the light-emitting element 300 is not limited thereto, and the light-emitting element 300 may have various shapes such as a regular hexahedron, a rectangular parallelepiped, and a hexagonal column.

Figure 7:
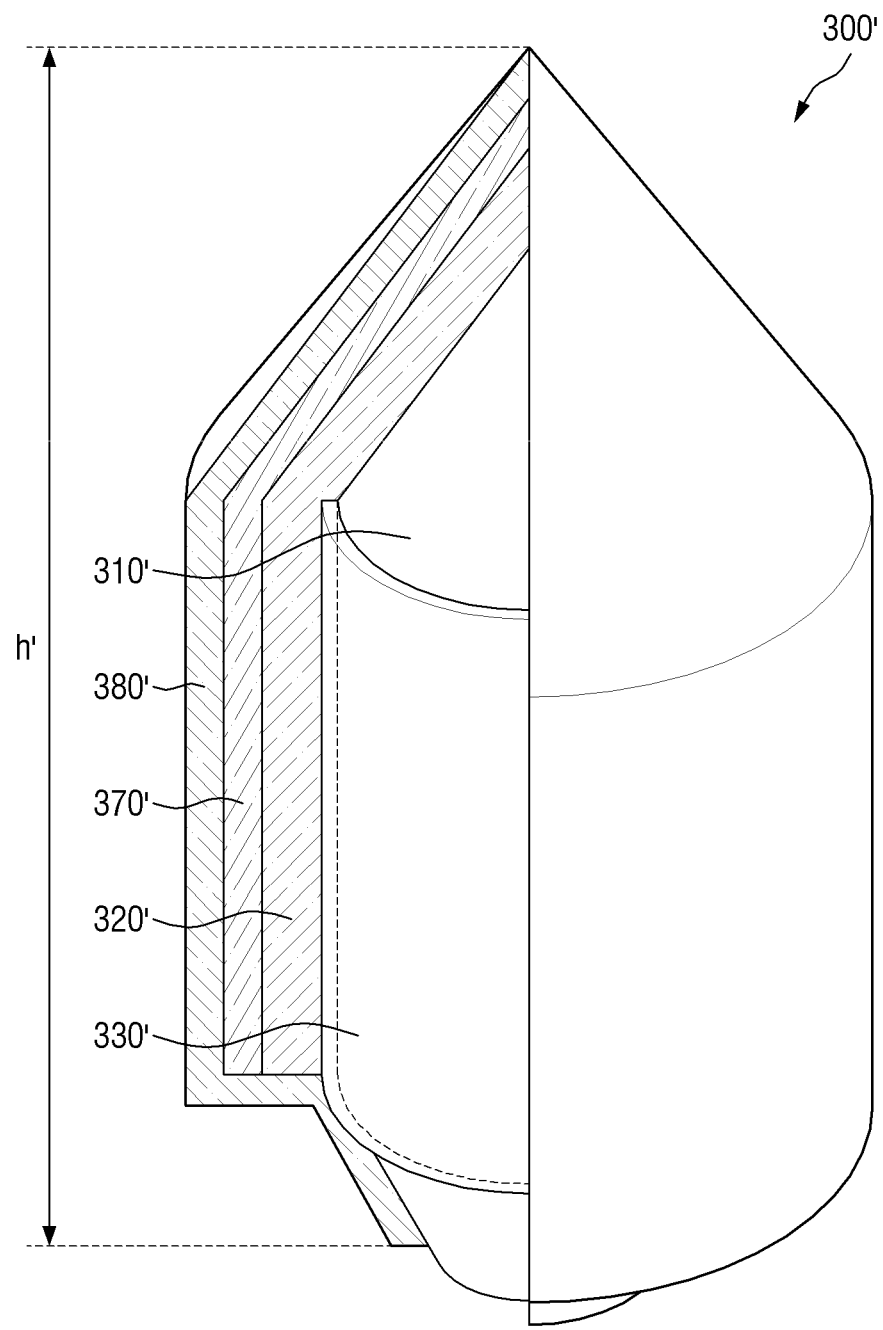
FIG. 7 is a schematic view of a light-emitting element according to another embodiment.

FIG. 7 is a schematic view of a light-emitting element according to another embodiment.

Referring to FIG. 7, a plurality of layers of a light-emitting element 300' may not be stacked in one direction, and each layer may be formed to surround an outer surface of another layer. The light-emitting element 300' of FIG. 7 is the same as the light-emitting element 300 of FIG. 6 except that the shape of each layer thereof is partially different from that of the light-emitting element 300. Hereinafter, the same (duplicative) contents will be omitted, and differences will be described.

According to some embodiments, a first conductivity-type semiconductor 310' may extend in one direction, and both end portions thereof may be formed to be inclined toward a center thereof. The first conductivity-type semiconductor 310' of FIG. 7 may include a body portion with a rod-like shape or a cylindrical shape, and upper and lower end portions with a conical shape formed on and below the body portion. The upper end portion on the body portion may have a steeper inclination than the lower end portion.

An active layer 330' is disposed to surround an outer surface of the body portion of the first conductivity-type semiconductor 310'. The active layer 330' may have an annular shape extending in one direction. The active layer 330' is not formed on the upper end portion and the lower end portion of the first conductivity-type semiconductor 310'. That is, the active layer 330' may be in contact with only a parallel side surface of the first conductivity-type semiconductor 310'.

A second conductivity-type semiconductor 320' is disposed to surround an outer surface of the active layer 330' and the upper end portion of the first conductivity-type semiconductor 310'. The second conductivity-type semiconductor 320' may include a body portion with an annular shape extending in one direction and an upper end portion formed to have an inclined side surface. That is, the second conductivity-type semiconductor 320' may be in direct contact with a parallel side surface of the active layer 330' and the inclined upper end portion of the first conductivity-type semiconductor 310'. However, the second conductivity-type semiconductor 320' is not formed on the lower end portion of the first conductivity-type semiconductor 310'.

An electrode material layer 370' is disposed to surround an outer surface of the second conductivity-type semiconductor 320'. That is, the electrode material layer 370' may have substantially the same shape as the second conductivity-type semiconductor 320'. That is, the electrode material layer 370' may be in contact with the entire outer surface of the second conductivity-type semiconductor 320'.

An insulating film 380' may be disposed to surround outer surfaces of the electrode material layer 370' and the first conductivity-type semiconductor 310'. The insulating film 380' may be in direct contact with the lower end portion of the first conductivity-type semiconductor 310' and exposed lower ends of the active layer 330' and the second conductivity-type semiconductor 320' including the electrode material layer 370'.

Meanwhile, the light-emitting element 300' of FIG. 7 may be disposed such that one direction in which the first conductivity-type semiconductor 310' extends is parallel to a direction horizontal to a via layer 200 of a display device 10. That is, the light-emitting element 300' may have a structure in which the plurality of layers are stacked in a direction perpendicular to the via layer 200 in a cross section.

Figure 8:
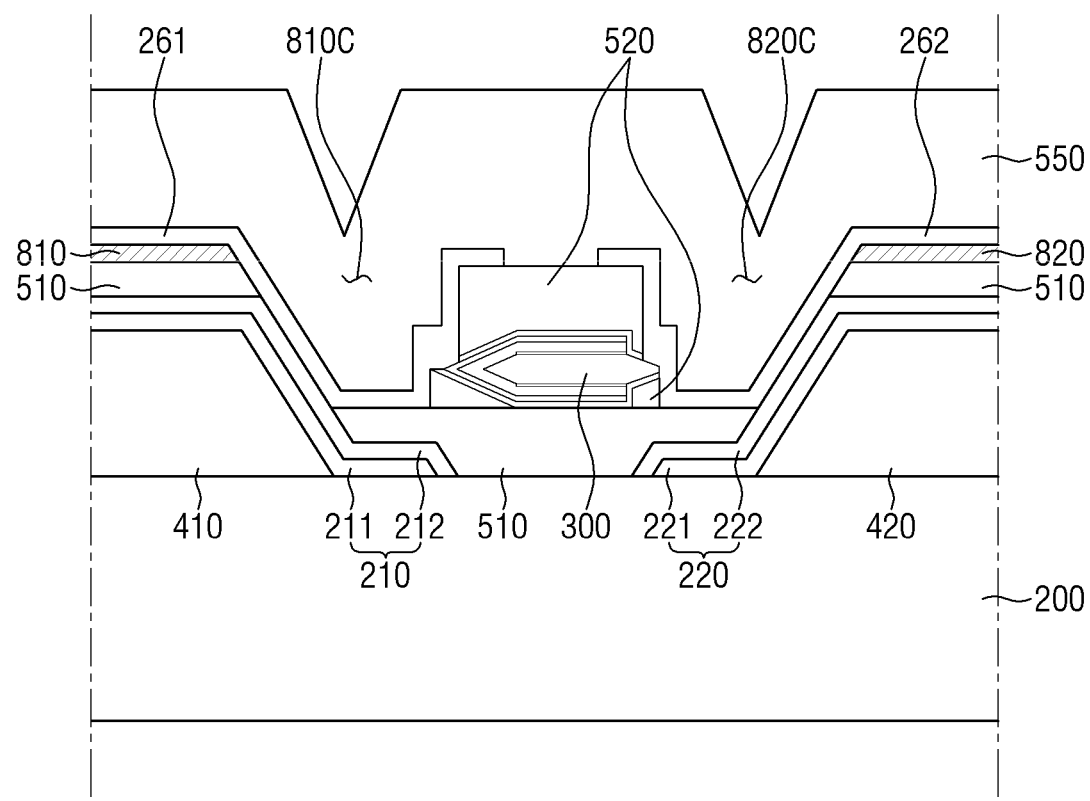
FIG. 8 is a schematic view illustrating a cross section of the light-emitting element disposed between electrodes according to another embodiment.

FIG. 8 is a schematic view illustrating a cross section of the light-emitting element disposed between electrodes according to another embodiment.

Referring to FIG. 8, the light-emitting element 300' of FIG. 7 may be disposed in the display device 10 according to some embodiments. The light-emitting element 300' is disposed such that a direction in which the body portion of the first conductivity-type semiconductor 310' extends is parallel to the via layer 200. Accordingly, the light-emitting element 300' may be disposed to have a structure in which the insulating film 380', the electrode material layer 370', the second conductivity-type semiconductor 320', the active layer 330', and the first conductivity-type semiconductor 310' are sequentially stacked perpendicular to the via layer 200 in a cross section thereof. In addition, each layer of the light-emitting element 300' may be disposed to surround the outer surface of another layer and may have a symmetrical structure based on a center of the cross section thereof. That is, the light-emitting element 300' may have a structure in which the active layer 330', the second conductivity-type semiconductor 320', the electrode material layer 370', and the insulating film 380' may be sequentially stacked based on the first conductivity-type semiconductor 310'.

Meanwhile, the insulating film 380' in areas of both end portions of the light-emitting element 300 in contact with a contact electrode 260 may be partially patterned and removed. When a second insulating layer 520 is patterned after the light-emitting element 300' is aligned, the insulating film 380' of the light-emitting element 300' may be partially removed so that the electrode material layer 370' and the first conductivity-type semiconductor 310' may be partially exposed. Such an exposed area of the light-emitting element 300' may be in direct contact with the contact electrode 260.

In addition, the light-emitting element 300' of FIG. 7 includes the upper end portion and the lower end portion whose side surfaces are inclined with respect to the body portion. In the light-emitting element 300' disposed on a first insulating layer 510, a side surface of the body portion may be in contact with the first insulating layer 510, and the inclined side surfaces of the upper and lower portions may be spaced apart from the first insulating layer 510. Referring to FIG. 8, in the display device 10 according to some embodiments, the second insulating layer 520 may be further disposed in a separation area between the light-emitting element 300' and the first insulating layer 510. As described above, because the second insulating layer 520 includes an organic material, when the second insulating layer 520 may be formed, the second insulating layer 520 may be interposed even between the light-emitting element 300' and the first insulating layer 510. Accordingly, even when the light-emitting element 300' has the inclined side surface, the light-emitting element 300' may be fixed onto the first insulating layer 510. However, the present disclosure is not limited thereto.

Meanwhile, a length h of the light-emitting element 300 may range from 1 μm to 10 μm, or range from 2 μm to 5 μm, and may be about 4 μm. In addition, the light-emitting element 300 may have a diameter ranging from 300 nm to 700 nm, and the plurality of light-emitting elements 300 included in the display device 10 may have different diameters according to a difference in composition of the active layer 330. The light-emitting element 300 may have a diameter of about 500 nm.

Hereinafter, a method of manufacturing the display device 10 according to some embodiments will be described with reference to FIGS. 9 to 15. Hereinafter, portions of the method of manufacturing the display device 10 will be described with reference to schematic cross-sectional views.

FIGS. 9 to 15 are schematic cross-sectional views illustrating a method of manufacturing a display device according to some embodiments. Hereinafter, a process sequence of a method of manufacturing a display device 10 will be described in detail, and the structures, materials, and functions of members formed in a manufacturing process of the display device 10 will be omitted. In particular, the structure of the display device 10 shown in FIGS. 9 to 15 is only schematically illustrated, and the display device 10 according to some embodiments is not limited thereto.

Figure 9:
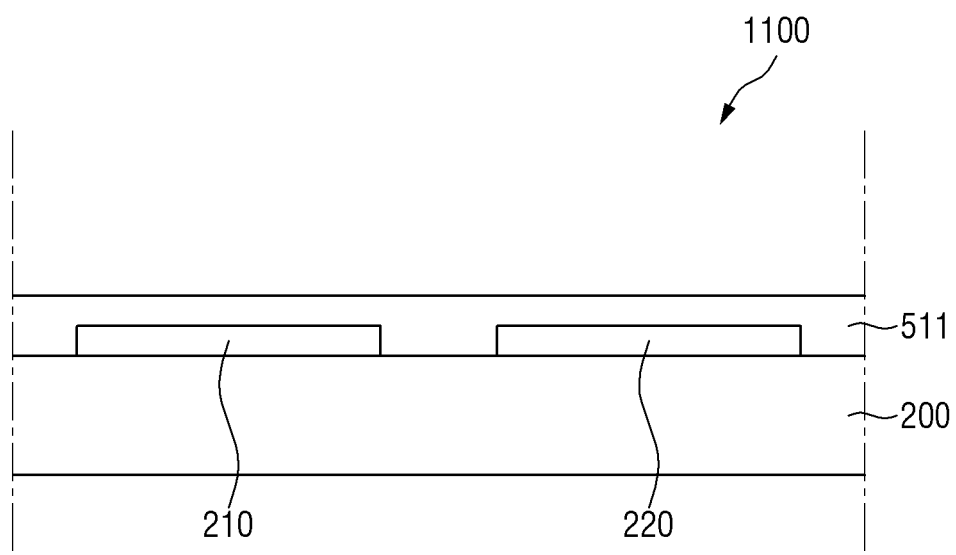
FIGS. 9 to 15 are schematic cross-sectional views illustrating a method of manufacturing a display device according to some embodiments.

First, referring to FIG. 9, a first substrate layer, which includes first and second electrodes 210 and 220 disposed on a via layer 200 and a first insulating material layer 511 covering the first electrode 210 and the second electrode 220, is provided.

The shapes and structures of the via layer 200, the first electrode 210, and the second electrode 220 are the same as those described above with reference to FIG. 2 or 4. However, unlike that shown in FIG. 2, the first insulating material layer 511 may be disposed on the via layer 200 to entirely cover the via layer 200 including the first electrode 210 and the second electrode 220. The first insulating material layer 511 may be patterned in an operation to be described below to form the first insulating layer 510 of FIG. 2. In addition, it may be understood that the first substrate layer of FIG. 9 is illustrated by omitting a plurality of banks 410, 420, and 430 as compared with FIG. 4. However, the present disclosure is not limited thereto, and the display device 10 according to some embodiments may be manufactured so as to include the banks 410, 420, and 430 as shown in FIG. 4.

Meanwhile, the first insulating material layer 511 of FIG. 9 may have substantially the same shape as the first insulating layer 510 of FIG. 5. That is, a partial area of the first insulating material layer 511 of FIG. 9 may be patterned to form the first insulating layer 510 of FIG. 2 or 4, and the remaining area thereof may not be patterned to form the same shape as the first insulating layer 510 of FIG. 5.

Figure 10:
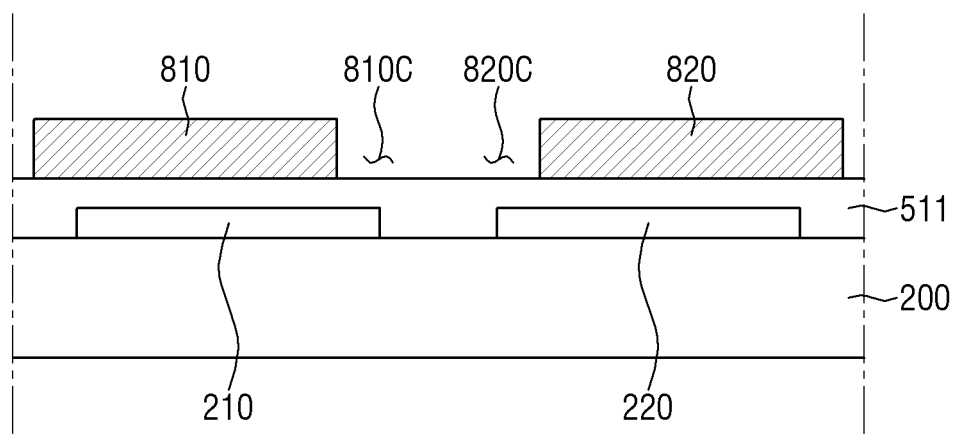
Figure 11:
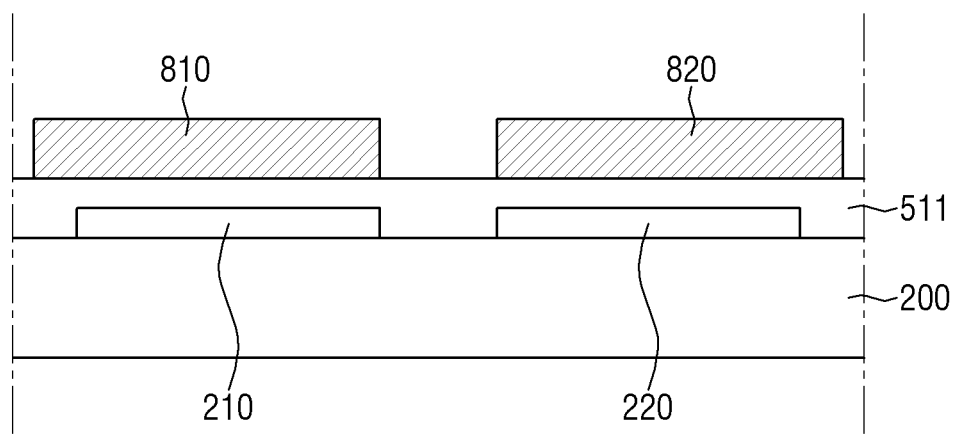

Next, referring to FIGS. 10 and 11, a shielding electrode layer 800 is formed on the first insulating material layer 511 of the first substrate layer 1100. As described above, the shielding electrode layer 800 may include a first shielding electrode 810 and a second shielding electrode 820, which may include a first recess pattern portion 810C and a second recess pattern portion 820C, respectively. FIG. 10 is a cross-sectional view illustrating areas in which the first and second recess pattern portions 810C and 820C are formed in the first and second shielding electrodes 810 and 820, and FIG. 11 is a cross-sectional view illustrating an area in which the first and second recess pattern portions 810C and 820C are not formed.

FIG. 10 illustrates that partial areas of the first electrode 210 and the second electrode 220 are exposed through the first insulating material layer 511 by the recess pattern portions 810C and 820C, and FIG. 11 illustrates that the shielding electrodes 810 and 820 are disposed to cover the first electrode 210 and the second electrode 220. The first insulating material layer 511 in the areas in which the recess pattern portions 810C and 820C of FIG. 10 are positioned may be patterned and removed in an operation to be described below.

Figure 12:
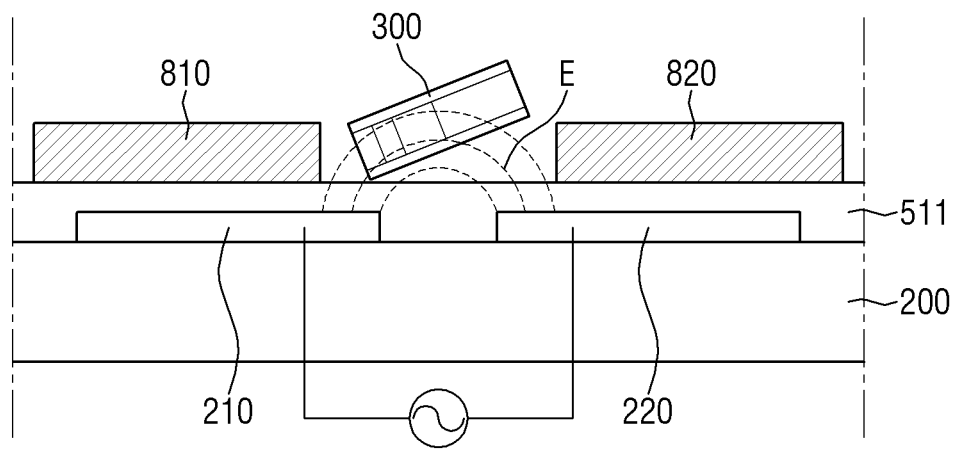
Figure 13:
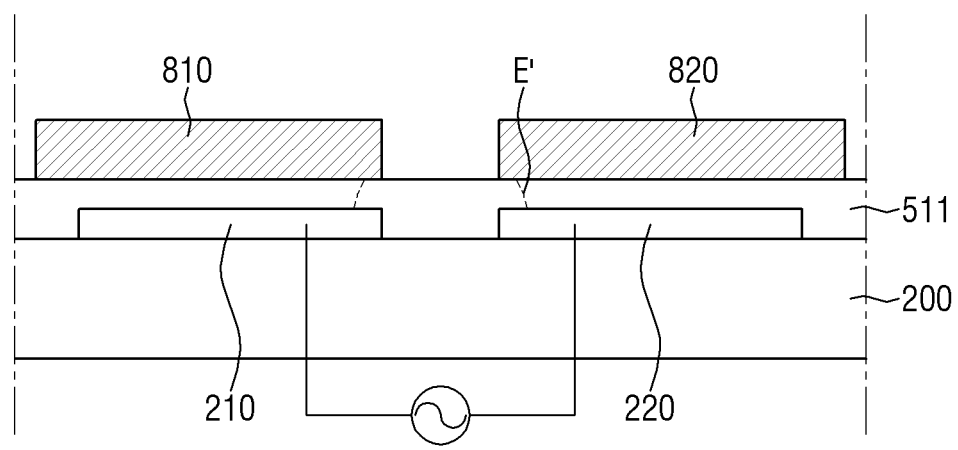

Next, referring to FIGS. 12 and 13, light-emitting elements 300 are formed in an area between the first electrode 210 and the second electrode 220 exposed by the recess pattern portions 810C and 820C.

A method of aligning the light-emitting elements 300 may be performed in such a manner that a solution including the light-emitting elements 300 is sprayed on the electrodes 210 and 220 and the shielding electrodes 810 and 820, and alignment power is applied to each of the electrodes 210 and 220 to align the light-emitting elements 300. The alignment power may form an electric field between the electrodes 210 and 220 to apply a dielectrophoretic force to the light-emitting elements 300. The light-emitting elements 300 may be landed between the electrodes 210 and 220 in the solution by the dielectrophoretic force.

Meanwhile, the electric field by the alignment power may be formed only in an area in which the first electrode 210 and the second electrode 220 are exposed by the recess pattern portions 810C and 820C. As shown in FIG. 12, an electric field E by the alignment power may be formed in the area in which the electrodes 210 and 220 are exposed by the recess pattern portions 810C and 820C. On the contrary, as shown in FIG. 13, the first shielding electrode 810 and the second shielding electrode 820 entirely overlapping the electrodes 210 and 220 may block an electric field E' formed by the alignment power. The light-emitting elements 300 sprayed on the first electrode 210, the second electrode 220, and the shielding electrodes 810 and 820 may be aligned only in the area in which the recess pattern portions 810C and 820C are positioned and thus the electric field E is formed, and may not be aligned in the area in which the shielding electrodes 810 and 820 are formed. Accordingly, the light-emitting element 300 may be selectively aligned in the area in which the recess pattern portions 810C and 820C are formed.

Figure 14:
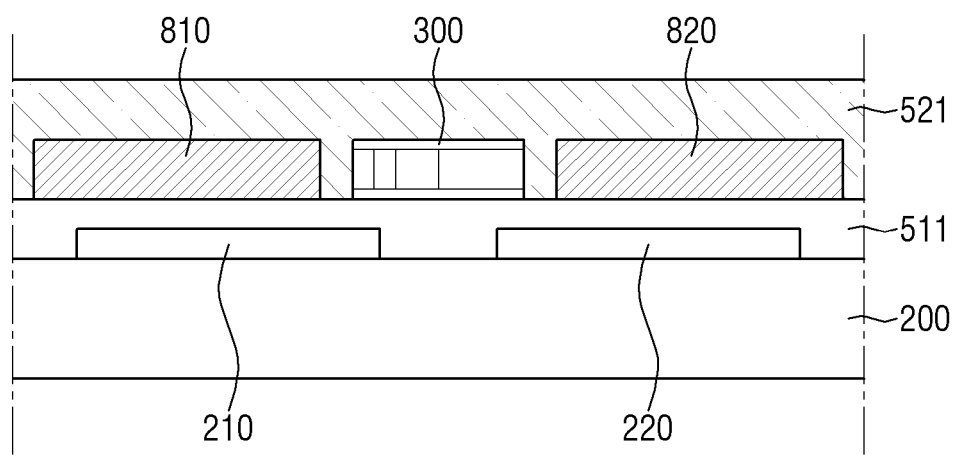

Next, referring to FIG. 14, a second insulating material layer 521 is formed on the light-emitting element 300 and the shielding electrodes 810 and 820. The second insulating material layer 521 may be disposed to entirely cover the first substrate layer and the shielding electrodes 810 and 820. The second insulating material layer 521 may be patterned in an operation to be described below to form a second insulating layer 520.

Figure 15:
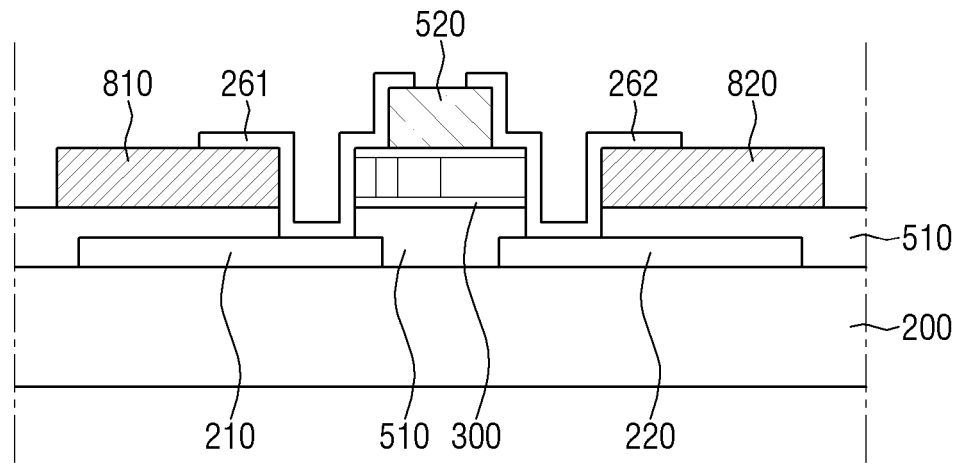

Next, referring to FIG. 15, the second insulating material layer 521 and the first insulating material layer 511 below the recess pattern portions 810C and 820C may be patterned to form the first insulating layer 510 and the second insulating layer 520, and form a contact electrode 260 in contact with the electrodes 210 and 220, the light-emitting element 300, and the shielding electrodes 810 and 820. The contact electrode 260 may include a first contact electrode 261 and a second contact electrode 262, and the first contact electrode 261 and the second contact electrode 262 may be disposed to be spaced apart from each other on the second insulating layer 520 formed on the light-emitting element 300. Because descriptions thereof are the same as described above, detailed descriptions thereof will be omitted.

Meanwhile, in some cases, as shown in FIG. 2, the second insulating layer 520 may be omitted, and the contact electrode 260 may be formed directly on the light-emitting element 300. In addition, another insulating layer may be disposed on the shielding electrodes 810 and 820, or partial areas of the shielding electrodes 810 and 820 may be patterned so that a contact area between the contact electrode 260 and the first and second electrodes 210 and 220 may be increased. This will be described in detail below.

Next, although not shown in the drawings, a passivation layer 550 may be formed so as to cover the plurality of members disposed on the via layer 200, thereby manufacturing the display device 10. In the display device 10 manufactured through the above-described processes, the light-emitting element 300 is selectively aligned only in the area in which the recess pattern portions 810C and 820C of the shielding electrode layer 800 are formed, thereby improving the alignment of the light-emitting element 300 and simultaneously reducing the number of the light-emitting elements 300 aligned in unnecessary areas.

Hereinafter, display devices 10 according to other embodiments will be described.

Figure 16:
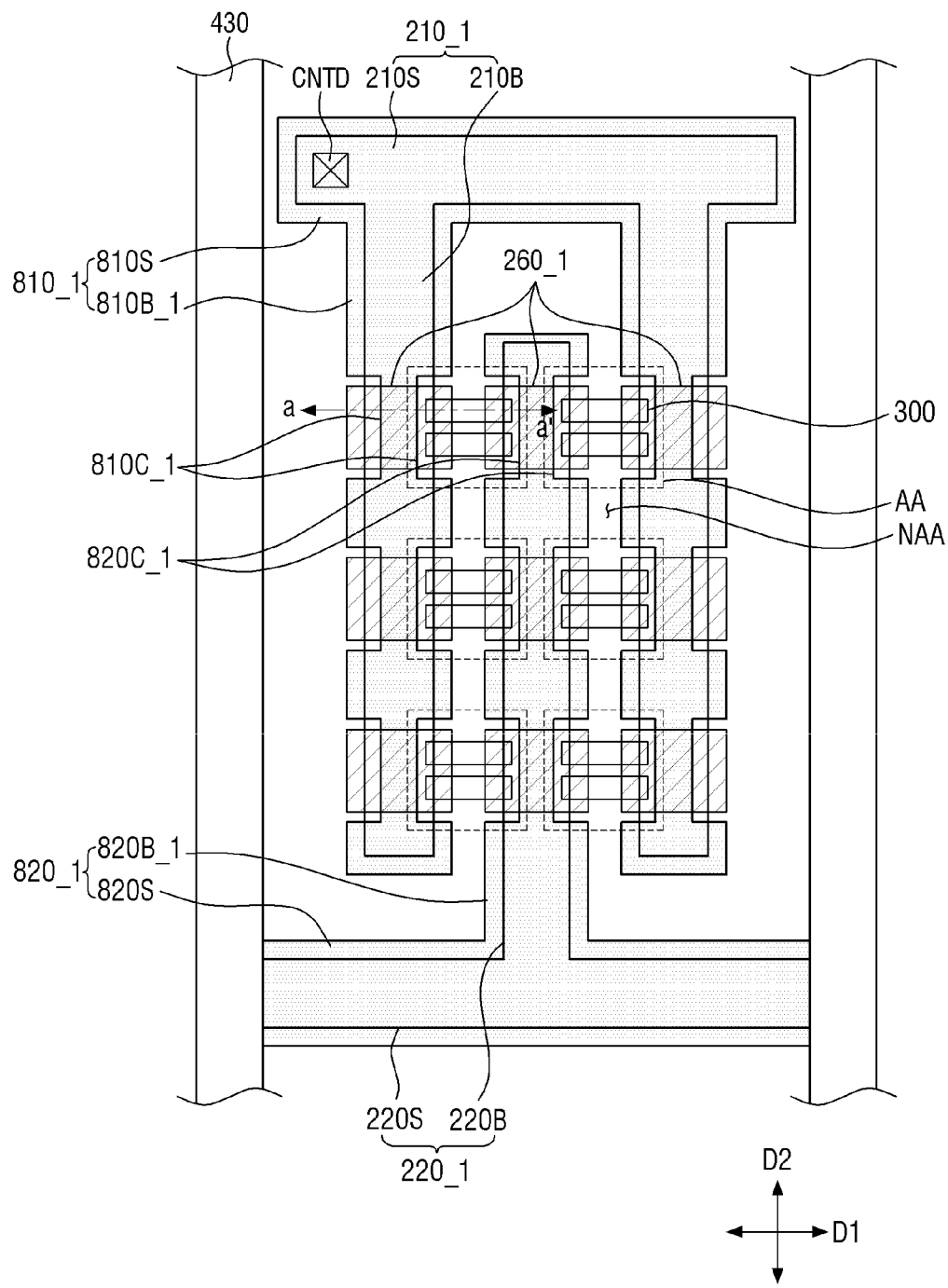
FIG. 16 is a plan view illustrating a display device according to another embodiment.

FIG. 16 is a plan view illustrating a display device according to another embodiment.

In a display device 10_1 according to the embodiment, a contact electrode 260_1 may be in contact with both side portions of shielding electrodes 810_1 and 820_1. Referring to FIG. 16, the shielding electrodes 810_1 and 820_1 may include recess pattern portions 810C_1 and 820C_1 formed in both side surfaces thereof, and the contact electrode 260_1 may be in contact with the shielding electrodes 810_1 and 820_1 and electrodes 210 and 220 in areas in which the recess pattern portions 810C_1 and 820C_1 are formed.

Specifically, a first shielding electrode branch portion 810B_1 disposed on a first electrode branch portion 210B may include first recessed pattern portions 810C_1 formed in both side surfaces thereof, and a second shielding electrode branch portions 820B_1 disposed on a second electrode branch portion 220B may include second recessed pattern portions 820C_1 formed in both side surfaces thereof. However, the first and second recess pattern portions 810C_1 and 820C_1 disposed in facing side surfaces of the first shielding electrode branch portion 810B_1 and the second shielding electrode branch portion 820B_1 may be formed before light-emitting elements 300 are aligned, and the first recess pattern portion 810C_1 disposed in an outer side surface of the first shielding electrode branch portion 810B_1 may be disposed when the contact electrode 260_1 is formed after the light-emitting elements 300 are aligned.

That is, in a manufacturing process of the display device 10_1, an operation of forming the first and second recess pattern portions 810C_1 and 820C_1 exposing facing side surfaces of the first electrode 210 and the second electrode 220 may be separated from an operation of forming the first recessed pattern portion 810C_1 exposing a side surface opposite to the facing side surface. When the contact electrode 260_1 is formed, as shown in FIG. 15, a process of patterning the first insulating material layer 511 and the second insulating material layer 521 is performed. Here, both side portions of the first and second shielding electrodes 810 and 820 may be patterned to form the display device 10_1 of FIG. 16.

Figure 17:
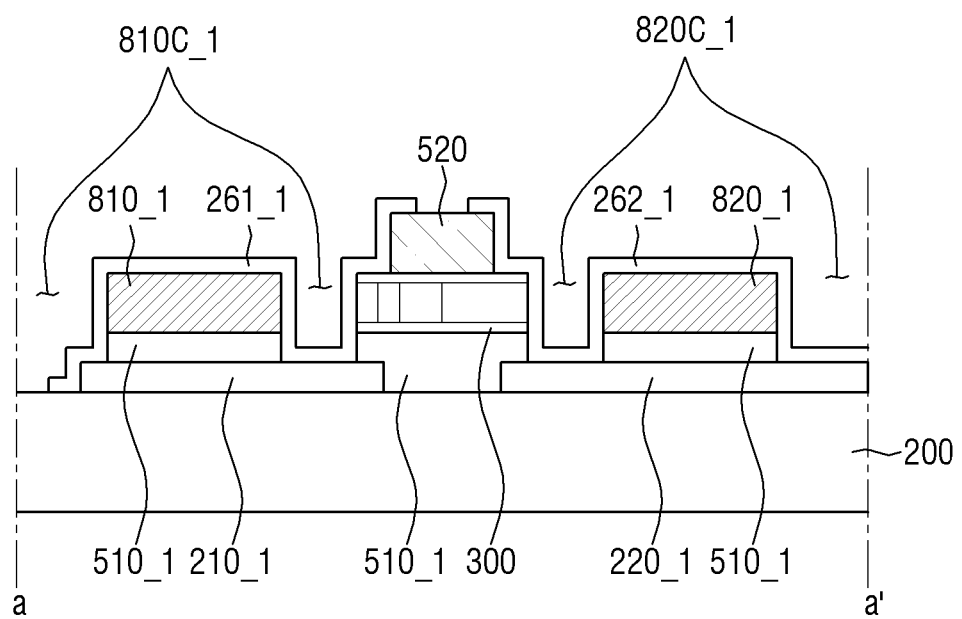
FIG. 17 is a schematic view illustrating one cross section of the display device of FIG. 16.

FIG. 17 is a schematic view illustrating one cross section of the display device of FIG. 16.

Referring to FIG. 17, unlike that shown in FIG. 2, in the display device 10_1 according to the embodiment, both side surfaces of each of the first shielding electrode 810_1 and the second shielding electrode 820_1 may be in contact with the contact electrode 260_1. Thus, the first electrode 210_1 and the second electrode 220_1 may also be in contact with the contact electrode 260_1 at one end of an area, in which the light-emitting element 300 is disposed, and the other end opposite to the one end, respectively. Accordingly, as compared to the display device 10 of FIG. 1, in the display device 10_1 of FIG. 16, the contact electrode 260_1 may be in contact with the electrodes 210_1 and 220_1 and the shielding electrodes 810_1 and 820_1 in a larger area, and thus, a current can safely flow through the electrodes 210_1 and 220_1.

Meanwhile, the display device 10 according to some embodiments may further include a third insulating layer 530 disposed between the shielding electrode layer 800 and the contact electrode 260.

Figure 18:
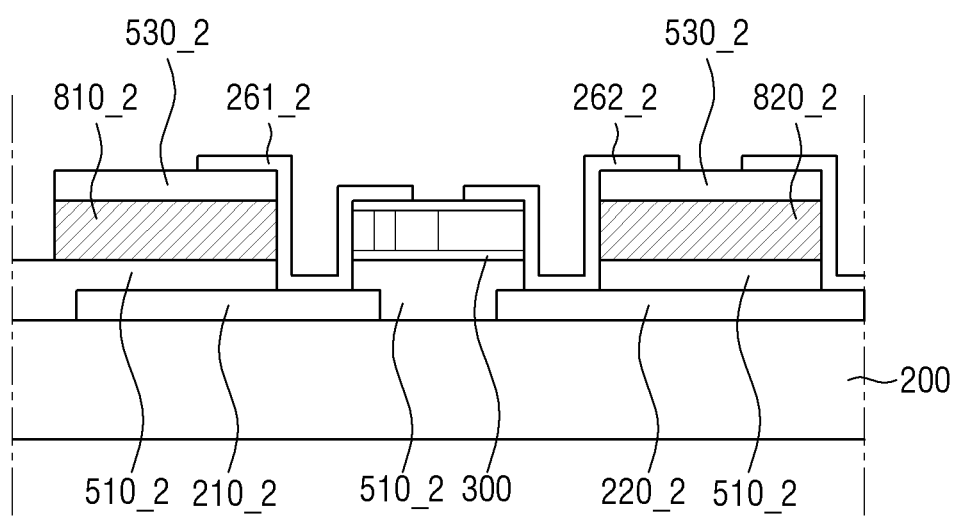
FIGS. 18 to 20 are schematic views illustrating cross sections of display devices according to other embodiments.
Figure 19:
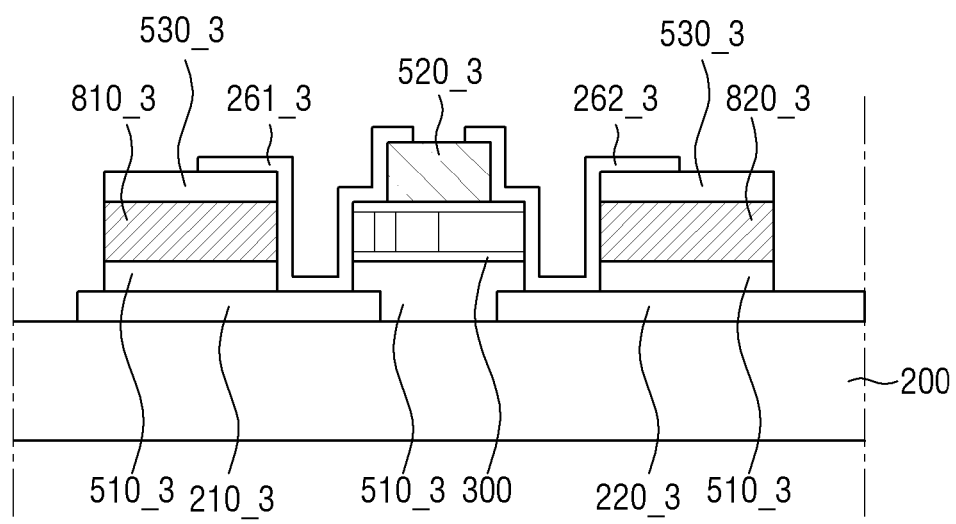
Figure 20:
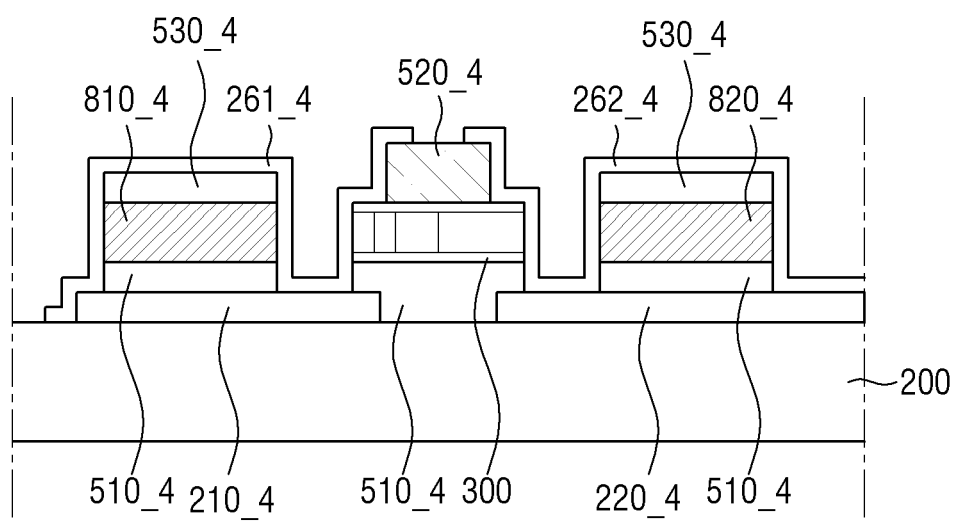

FIGS. 18 to 20 are schematic views illustrating cross sections of display devices according to other embodiments.

Referring to FIG. 18, a display device 10_2 according to the embodiment may further include third insulating layer 530_2 disposed on a first shielding electrode 810_2 and a second shielding electrode 820_2. When the display device 10_2 is manufactured, after the shielding electrodes 810_2 and 820_2 are formed, the third insulating layer 530_2 may be disposed to cover the shielding electrodes 810_2 and 820_2 and then may be patterned and formed. An area between a first electrode 210_2 and a second electrode 220_2, in which light-emitting elements 300 are aligned, may be patterned, and thus, the third insulating layer 530_2 may be disposed on each of the first shielding electrode 810_2 and the second shielding electrode 820_2. In a manufacturing process of the display device 10_2 according to the embodiment, the third insulating layer 530_2 is disposed to cover the shielding electrodes 810_2 and 820_2, thereby effectively blocking an electric field formed by an alignment signal. In addition, because the third insulating layer 530_2 is disposed between a contact electrode 260_2 and the first and second shielding electrodes 810_2 and 820_2, the electrical connection therebetween can be stabilized.

A display device 10_3 of FIG. 19 is the same as the display device 10_2 of FIG. 18 except that a second insulating layer 520_3 is disposed on a light-emitting element 300. A display device 10_4 of FIG. 20 is the same as the display device 10_3 of FIG. 19 except that a contact electrode 260_4 is in contact with both side surfaces of a third insulating layer 530_4 and first and second shielding electrodes 810_4 and 820_4. Because descriptions of the structures thereof are the same as described above, detailed descriptions thereof will be omitted.

Figure 21:
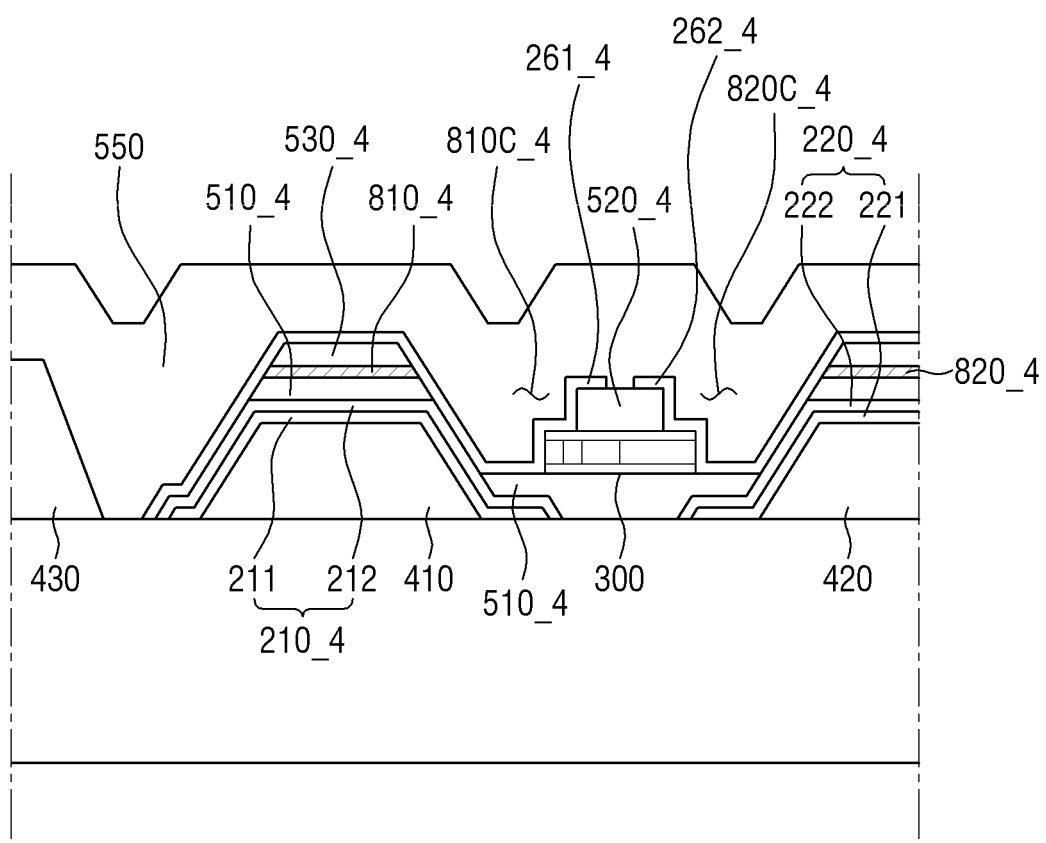
FIG. 21 is a cross-sectional view of a display device including a third insulating layer according to some embodiments.

FIG. 21 is a cross-sectional view of a display device including a third insulating layer according to some embodiments.

Referring to FIG. 21, unlike the display device 10 of FIG. 4, a first insulating layer 510_4 may be disposed on upper surfaces of a first electrode 210_4 and a second electrode 220_4, and first and second shielding electrodes 810_4 and 820_4 and a third insulating layer 530_4 may be disposed on the first insulating layer 510_4. A first contact electrode 261_4 and a second contact electrode 262_4 may be respectively in contact with side surfaces of the first electrode 210_4 and the second electrode 220_4, and simultaneously may be in contact with the first insulating layer 510_4, the first and second shielding electrodes 810_4 and 820_4, and the third insulating layer 530_4.

Meanwhile, the shielding electrode layer 800 of the display device 10 may be disposed to not overlap the electrodes 210 and 220. The display device 10 according to some embodiments may include the shielding electrode layer 800 forming one or more shielding electrode patterns 830, and the shielding electrode pattern 830 may not overlap the electrodes 210 and 220 and may be disposed only in a separation area between the electrodes 210 and 220.

Figure 22:
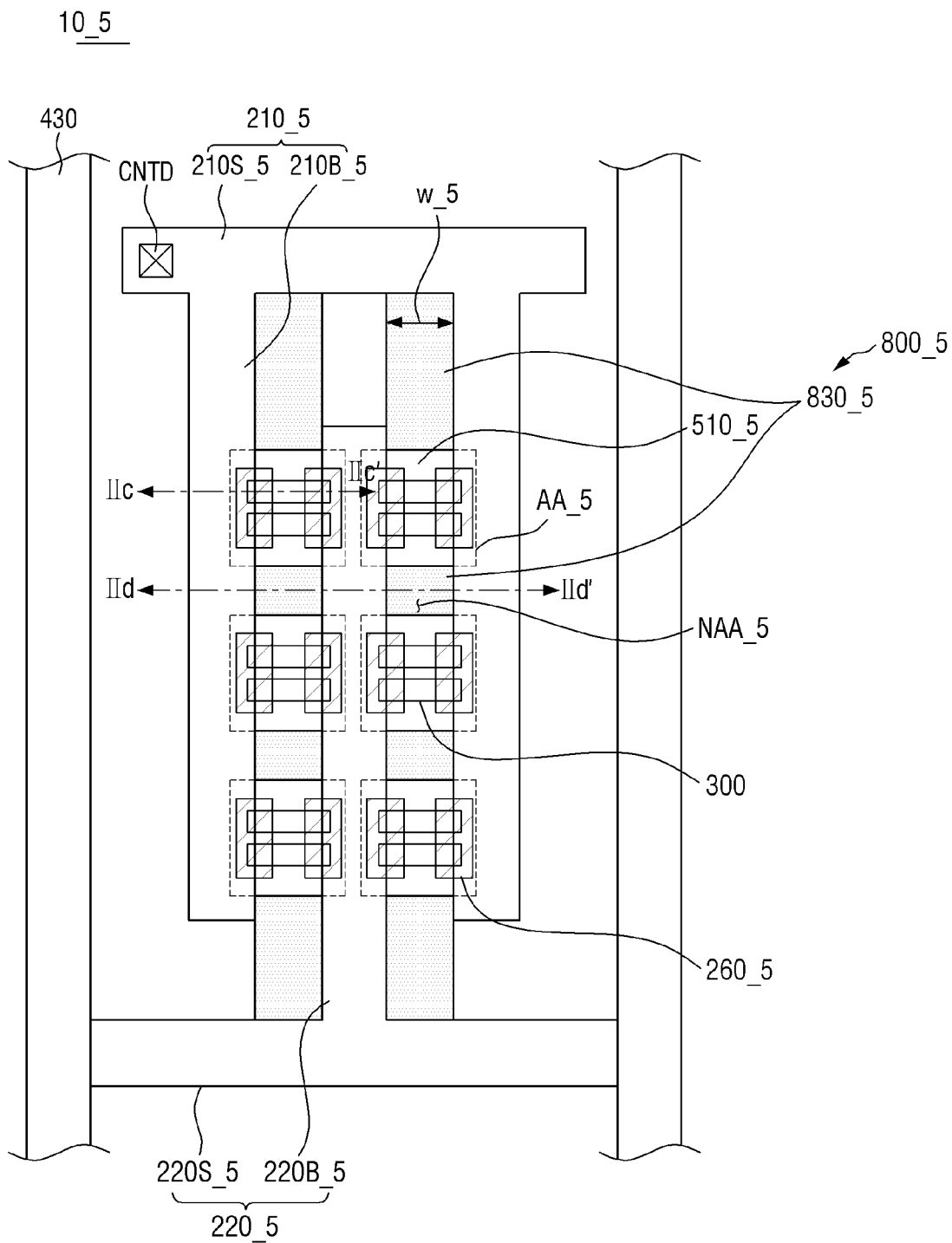
FIG. 22 is a plan view of a display device according to another embodiment.
Figure 23:
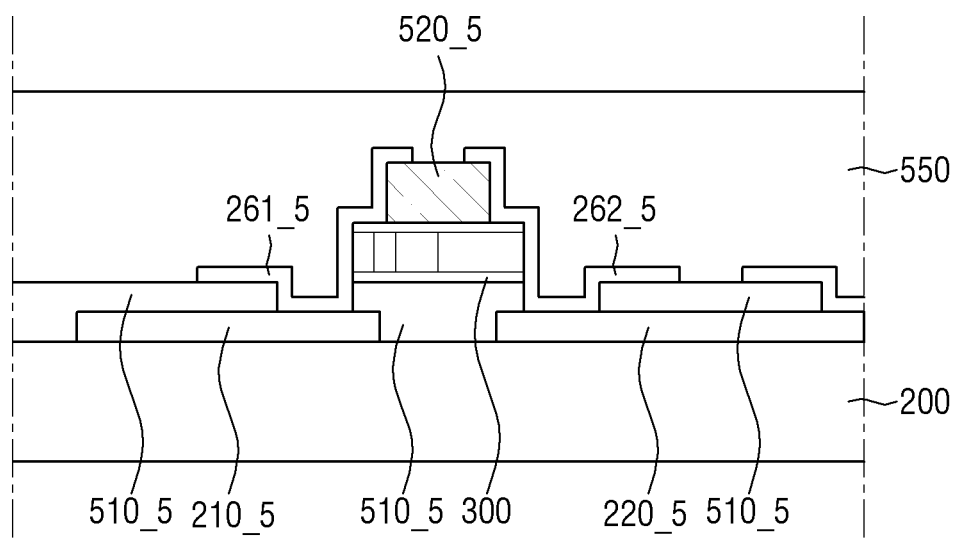
FIG. 23 is a schematic view of a cross section taken along line IIc-IIc' of FIG. 22.
Figure 24:
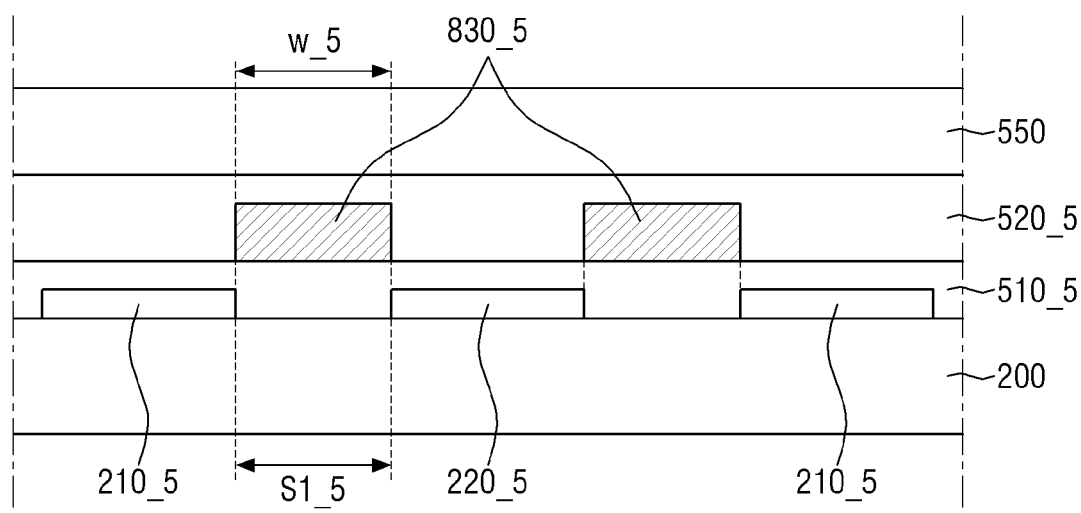
FIG. 24 is a schematic view of a cross section taken along line IId-IId' of FIG. 22.

FIG. 22 is a plan view of a display device according to another embodiment. FIG. 23 is a schematic view of a cross section taken along line IIc-IIc' of FIG. 22, and FIG. 24 is a schematic view of a cross section taken along line IId-IId' of FIG. 22.

A display device 10_5 of FIG. 22 is substantially the same as that of FIG. 1 except that a shape of a shielding electrode layer 800_5 is different from that of FIG. 1. Hereinafter, differences will be described in detail.

Referring to FIG. 22, the shielding electrode layer 800_5 of the display device 10_5 may include a plurality of shielding electrode patterns 830_5. The shielding electrode patterns 830_5 may be disposed to be spaced from each other in a first direction D1 and a second direction D2 in separation areas between a first electrode 210 and a second electrode 220, for example, between first electrode branch portions 210B_5 and a second electrode branch portion 220B_5.

The shielding electrode patterns 830_5 may be disposed on a first insulating layer 510_5 to form patterns in the second direction D2, and the first insulating layer 510_5 may be exposed in areas in which the shielding electrode patterns 830_5 are not disposed. That is, the first insulating layer 510_5 may also form patterns in the second direction D2 in a plan view. In a manufacturing process of the display device 10_5, an area in which the shielding electrode pattern 830_5 is not disposed and the first insulating layer 510_5 is exposed may be an area in which an electric field is formed, and an area in which the shielding electrode pattern 830_5 is disposed may be an area in which the electric field is blocked. Accordingly, a plurality of light-emitting elements 300 may be disposed on the exposed first insulating layer 510_5 to form an alignment area AA_5, and the area in which the shielding electrode pattern 830_5 is disposed may form a non-alignment area NAA_5.

FIG. 23 is a cross-sectional view of the area in which the first insulating layer 510_5 is exposed, including the alignment area AA_5 in the display device 10_5 of FIG. 22, and FIG. 24 is a cross-sectional view of the area in which the shielding electrode pattern 830_5 is disposed, including the non-alignment area NAA_5.

Referring to FIG. 23, unlike the display device 10 of FIG. 2, the shielding electrode layer 800_5 may not be disposed on the first electrode 210_5 and the second electrode 220_5. The first insulating layer 510_5 may cover a portion of the first electrode 210_5 and a portion of the second electrode 220_5 and may be disposed between the first electrode 210_5 and the second electrode 220_5. Referring to FIG. 24, the light-emitting element 300 is not disposed in a cross section including the non-alignment area NAA_5, and the first insulating layer 510_5 is disposed to entirely cover upper surfaces of the first electrode 210_5 and the second electrode 220_5. The shielding electrode layer 800_5, that is, the shielding electrode pattern 830_5, may be disposed on the first insulating layer 510_5 and may be disposed to not overlap the first electrode 210_5 and the second electrode 220_5. Accordingly, a width w_5 of the shielding electrode pattern 830_5 may be the same as a distance S1_5 between the first electrode 210_5 and the second electrode 220_5.

The shielding electrode patterns 830_5 may be disposed between the first electrode 210_5 and the second electrode 220_5 and may be spaced apart from each other in one direction, for example, in a first direction D1, to form predetermined patterns. Even when an alignment signal is applied to the first electrode 210_5 and the second electrode 220_5, the shielding electrode pattern 830_5 disposed therebetween may block an electric field formed by the alignment signal.

In addition, according to some embodiments, a contact electrode 260 may not be disposed in the non-alignment area NAA_5, and the shielding electrode pattern 830_5 may be electrically insulated from the electrodes 210_5 and 220_5. Unlike the display device 10 of FIG. 1, in the display device 10_5 of FIG. 22, the shielding electrode layer 800_5 may be insulated from the electrodes 210_5 and 220_5 to maintain a floating state.

Meanwhile, the shielding electrode pattern 830 may partially overlap the first electrode 210 and the second electrode 220. Display devices 10_6 and 10_7 according to embodiments may include one or more shielding electrode patterns 830_6 and 830_7 partially overlapping the first electrode 210 and the second electrode 220.

Figure 25:
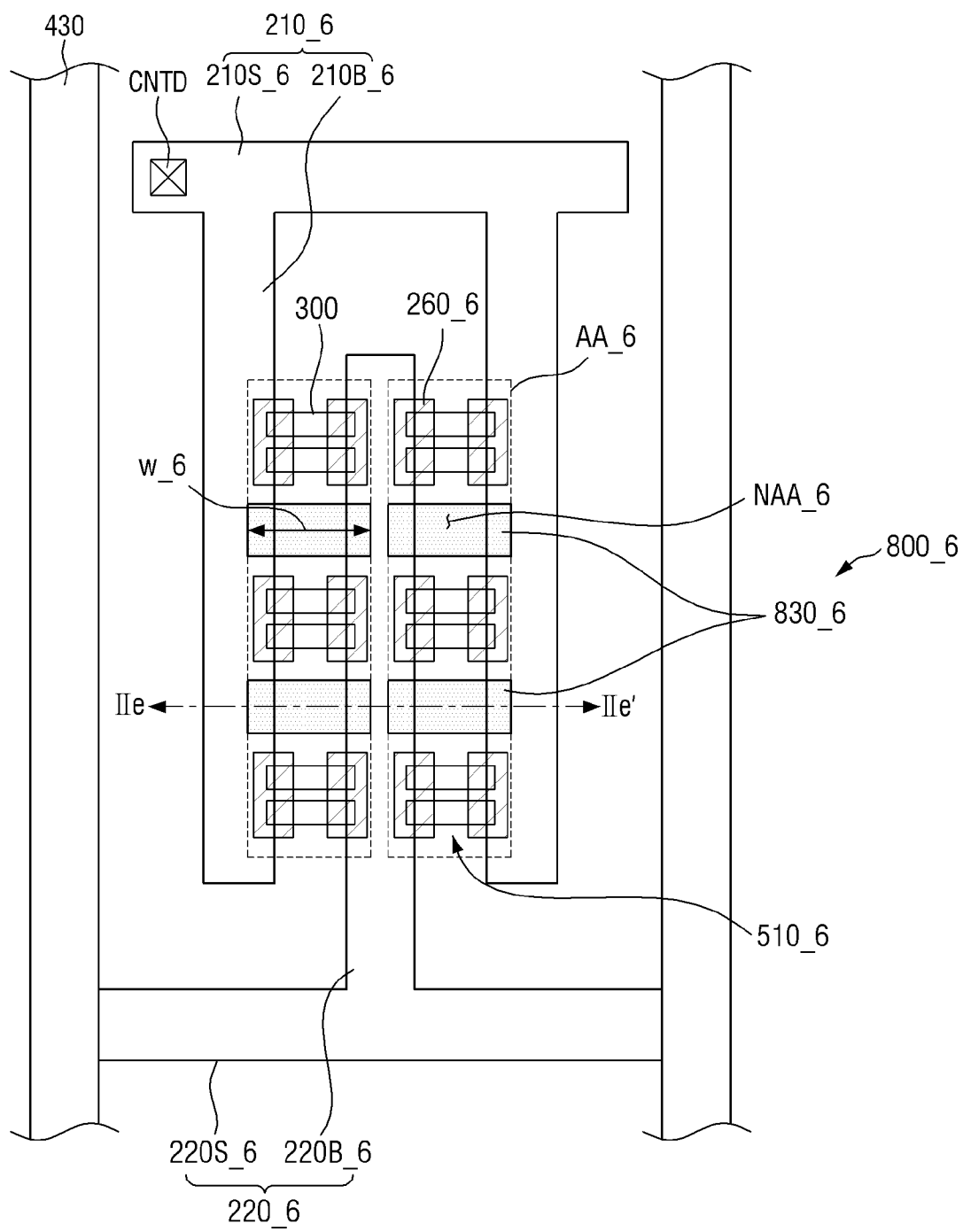
FIG. 25 is a plan view of a display device according to still another embodiment.
Figure 26:
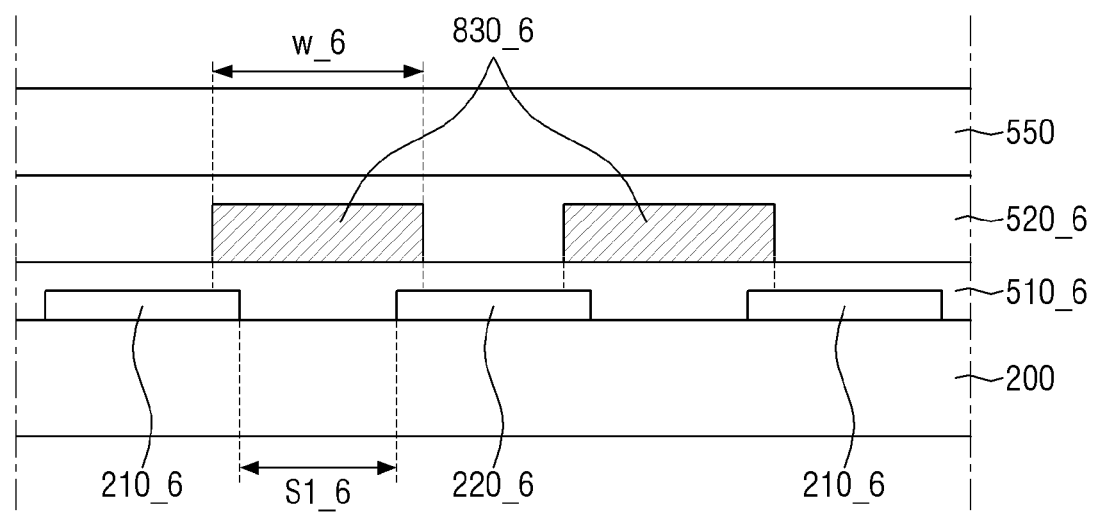
FIG. 26 is a cross-sectional view taken along line IIe-IIe' of FIG. 25.

FIG. 25 is a plan view of a display device according to still another embodiment. FIG. 26 is a cross-sectional view taken along line IIe-IIe' of FIG. 25.

A display device 10_6 of FIG. 25 is substantially the same as that of FIG. 22 except that a shape of a shielding electrode pattern 830_6 is different from that of FIG. 22. Hereinafter, differences will be described in detail.

Referring to FIG. 25, a shielding electrode layer 800_6 of the display device 10_6 may include shielding electrode patterns 830_6 disposed between a first electrode branch portion 210B_6 and a second electrode branch portion 220B_6 to partially overlap the first electrode branch portion 210B_6 and the second electrode branch portion 220B_6. The plurality of shielding electrode patterns 830_6 are disposed to have a predetermined width w_6 and may be spaced apart from each other in a first direction D1 and a second direction D2.

As described above, an area in which the shielding electrode pattern 830_6 is disposed is an area in which an electric field is blocked in a manufacturing process of the display device 10_6, and a non-alignment area NAA_6 is formed therein. In addition, an area in which the shielding electrode patterns 830_6 are spaced apart from each other may be an area in which a first insulating layer 510_6 is exposed and thus an electric field is formed, and a light-emitting element 300 may be disposed therein so that an alignment area AA_6 may be formed therein. In the shielding electrode patterns 830_6, a pattern may be spaced apart from another pattern in the second direction D2, and the first insulating layer 510_6 is exposed therebetween so that the alignment area AA_6 may be formed.

Meanwhile, according to some embodiments, the width w_6 of the shielding electrode pattern 830_6 measured in one direction, for example, in the first direction D1, may be greater than a separation area between electrodes, that is, a separation distance S1_6 between the first electrode branch portion 210B_6 and the second electrode branch portion 220B_6. Unlike the display device 10_5 of FIG. 22, in the display device 10_6 of FIG. 25, because the width w_6 of the shielding electrode pattern 830_6 is greater than the distance S1_6 between the first electrode branch portion 210B_6 and the second electrode branch portion 220B_6, the shielding electrode pattern 830_6 may partially overlap the first electrode branch portion 210B_6 and the second electrode branch portion 220B_6.

Referring to FIG. 26, the shielding electrode patterns 830_6 disposed on the first insulating layer 510_6 may be spaced apart from each other in the first direction D1 and may partially overlap a first electrode 210_6 and a second electrode 220_6. On the other hand, the shielding electrode patterns 830_6 may be disposed to be spaced apart from each other in the first direction D1 in areas overlapping the second electrode 220_6. Accordingly, it is possible to effectively block an electric field formed by an alignment signal in a manufacturing process of the display device 10_6 of FIG. 25.

Figure 27:
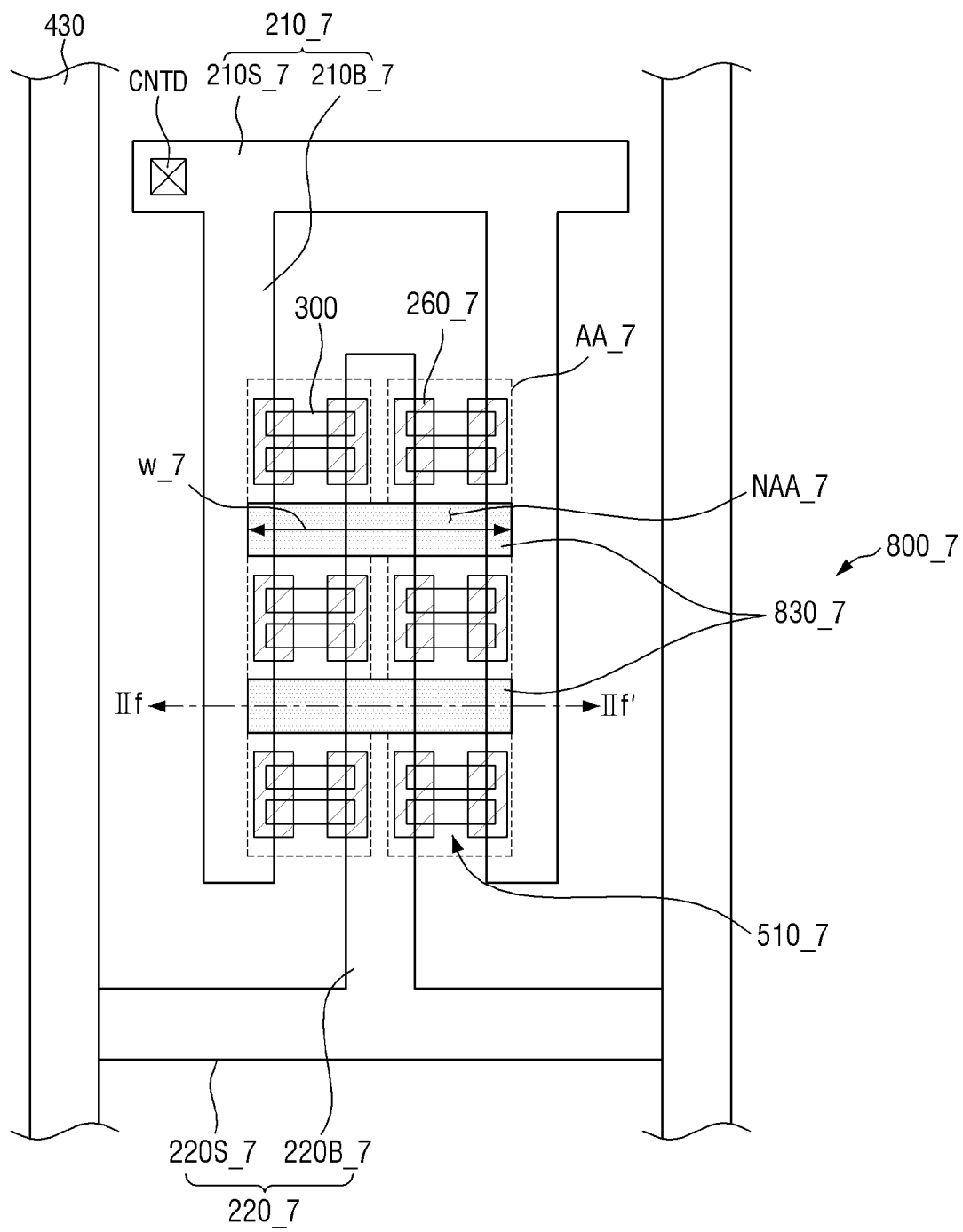
FIG. 27 is a plan view of a display device according to yet another embodiment.
Figure 28:
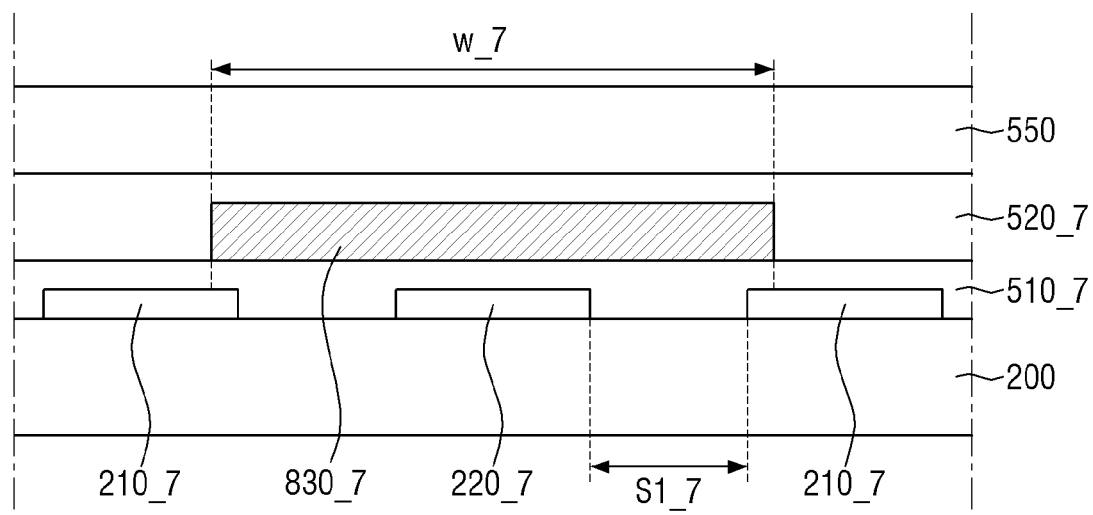
FIG. 28 is a cross-sectional view taken along line IIf-IIf' of FIG. 27.

FIG. 27 is a plan view of a display device according to yet another embodiment. FIG. 28 is a cross-sectional view taken along line of FIG. 27.

A display device 10_7 of FIG. 27 is substantially the same as that of FIG. 25 except that a shape of a shielding electrode pattern 830_7 is different from that of FIG. 25. Hereinafter, differences will be described in detail.

Referring to FIGS. 27 and 28, one shielding electrode pattern 830_7 may overlap two first electrode branch portions 210B_7 and one second electrode branch portion 220B_7 at the same time. As shown in the drawing, a width w_7 of the shielding electrode pattern 830_7 may be greater than the sum of widths of the electrode branch portion 210B_7 and 220B_7 and a distance S1_7 between the electrode branch portions 210b_7 and 220B_7. In this case, a plurality of shielding electrode patterns 830_7 may each extend in a first direction D1 and may be disposed to be spaced apart from each other only in a second direction D2.

Meanwhile, as described above with reference to FIG. 1, in the shielding electrode layer 800, the recess pattern portions 810C and 820C may be formed to expose at least partial areas of the electrodes 210 and 220. In this case, facing side surfaces of the first electrode branch portion 2106 and the second electrode branch portion 220B have a shape extending in one direction, and at least one side surfaces of the first shielding electrode 810 and the second shielding electrode 820 disposed thereon may be recessed to form patterns. However, the present disclosure is not limited thereto, and in some cases, the electrodes 210 and 220 may be disposed such that partial areas thereof protrude to not overlap the shielding electrode layer 800.

The electrodes 210 and 220 of the display device 10 according to some embodiments may include protruding pattern portions 210C and 220C formed by at least partial areas of side surfaces of the electrodes 210 and 220 protruding, and the protruding pattern portions 210C and 220C may not overlap the shielding electrode layer 800.

FIGS. 29 to 32 are plan views of display devices according to other embodiments.

Figure 29:
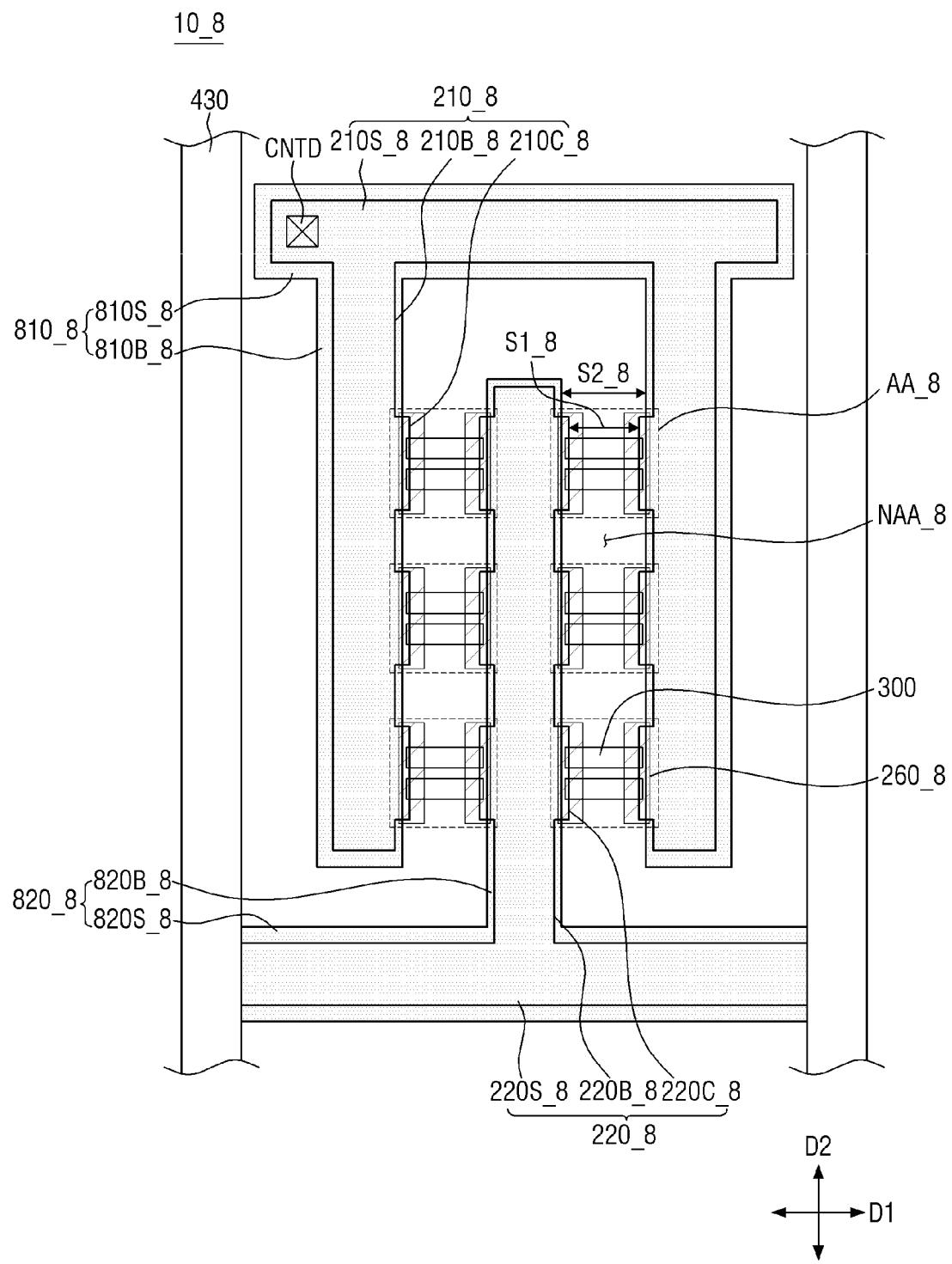
FIGS. 29 to 32 are plan views of display devices according to yet other embodiments.

First, referring to FIG. 29, in a display device 10_8 according to the embodiment, at least partial areas of one side surface of a first electrode branch portion 210B_8 facing a second electrode branch portion 220B_8, and at least partial areas of both side surfaces of the second electrode branch portion 220B_8 facing a respective first electrode branch portion 210B_8 may protrude to form protruding pattern portions 210C_8 and 220C_8. The first electrode branch portion 210B_8 may include first protruding pattern portions 210C_8 formed to protrude in a first direction D1 from one side surface thereof facing the second electrode branch portion 220B_8, and the second electrode branch portion 220B_8 may include second protruding pattern portions 220C_8 formed to protrude in the first direction D1 from both side surfaces thereof facing the first electrode branch portions 210B_8. Side surfaces of a first shielding electrode branch portion 810B_8 and a second shielding electrode branch portion 820B_8 may have a shape extending in one direction, and recess pattern portions 810C and 820C may not be formed therein. Even in this case, a separation distance S1_8 between the electrode branch portions 210B_8 and 220B_8 may be less than a separation distance S2_8 between the shielding electrode branch portions 810B_8 and 820B_8. The first protruding pattern portion 210C_8 and the second protruding pattern portion 220C_8 may not overlap a first shielding electrode 810_8 and a second shielding electrode 820_8, and thus, an electric field by an alignment signal may be formed in a manufacturing process of the display device 10_8.

On the other hand, the first shielding electrode 810_8 and the second shielding electrode 820_8 may be disposed to overlap areas of the first and second electrode branch portions 210B_8 and 220B_8, in which the protruding pattern portions 210C_8 and 220C_8 are not formed. The area is an area in which an electric field by an alignment signal is blocked in the manufacturing process of the display device 10_8. Accordingly, light-emitting elements 300 may be aligned on the protruding pattern portions 210C_8 and 220C_8 of the electrodes 210_8 and 220_8 so that an alignment area AA_8 may be formed, and a non-alignment area NAA_8 may be formed in an area in which the electrodes 210_8 and 220_8 overlap a shielding electrode layer 800_8.

Figure 30:
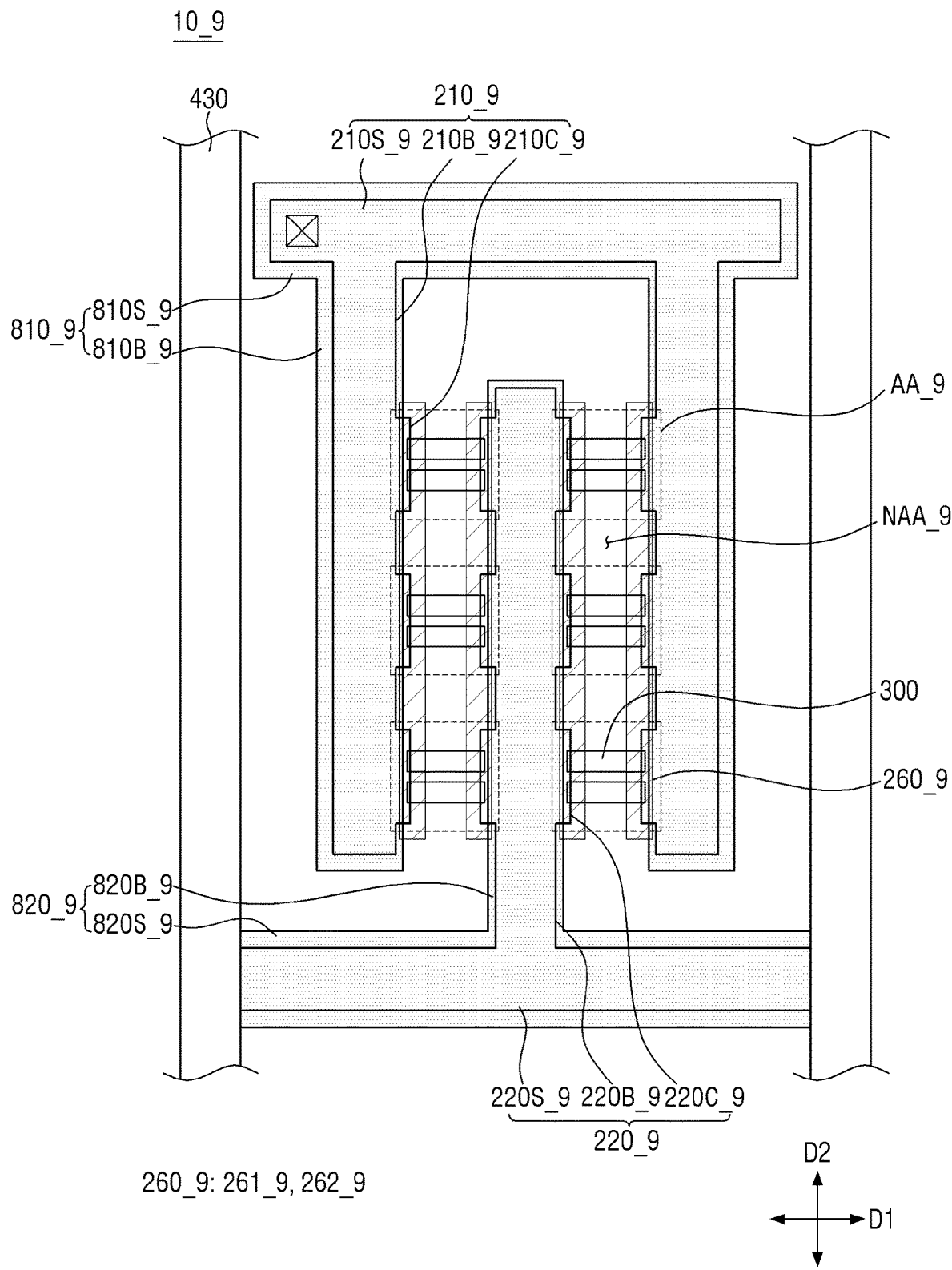

A display device 10_9 of FIG. 30 is the same as the display device 10_8 of FIG. 28 except that a contact electrode 260_9 has a shape extending in one direction, for example, in a second direction D2. Hereinafter, redundant descriptions will be omitted, and differences will be mainly described.

The contact electrode 260 of the display device 10 may extend in the second direction D2 and may be partially disconnected to form patterns. However, referring to FIG. 29, in the display device 10_9 according to the embodiment, the contact electrode 260_9 may extend in the second direction D2 to extend to a non-alignment area NAA_9. Accordingly, one first contact electrode 261_9 may be disposed on one side surface of a first electrode branch portion 210B_9 facing a second electrode branch portion 220B_9, and one second contact electrode 262_9 may be disposed on each of both side surfaces of a second electrode branch portion 220B_9 facing the first electrode branch portions 210B_9.

Figure 31:
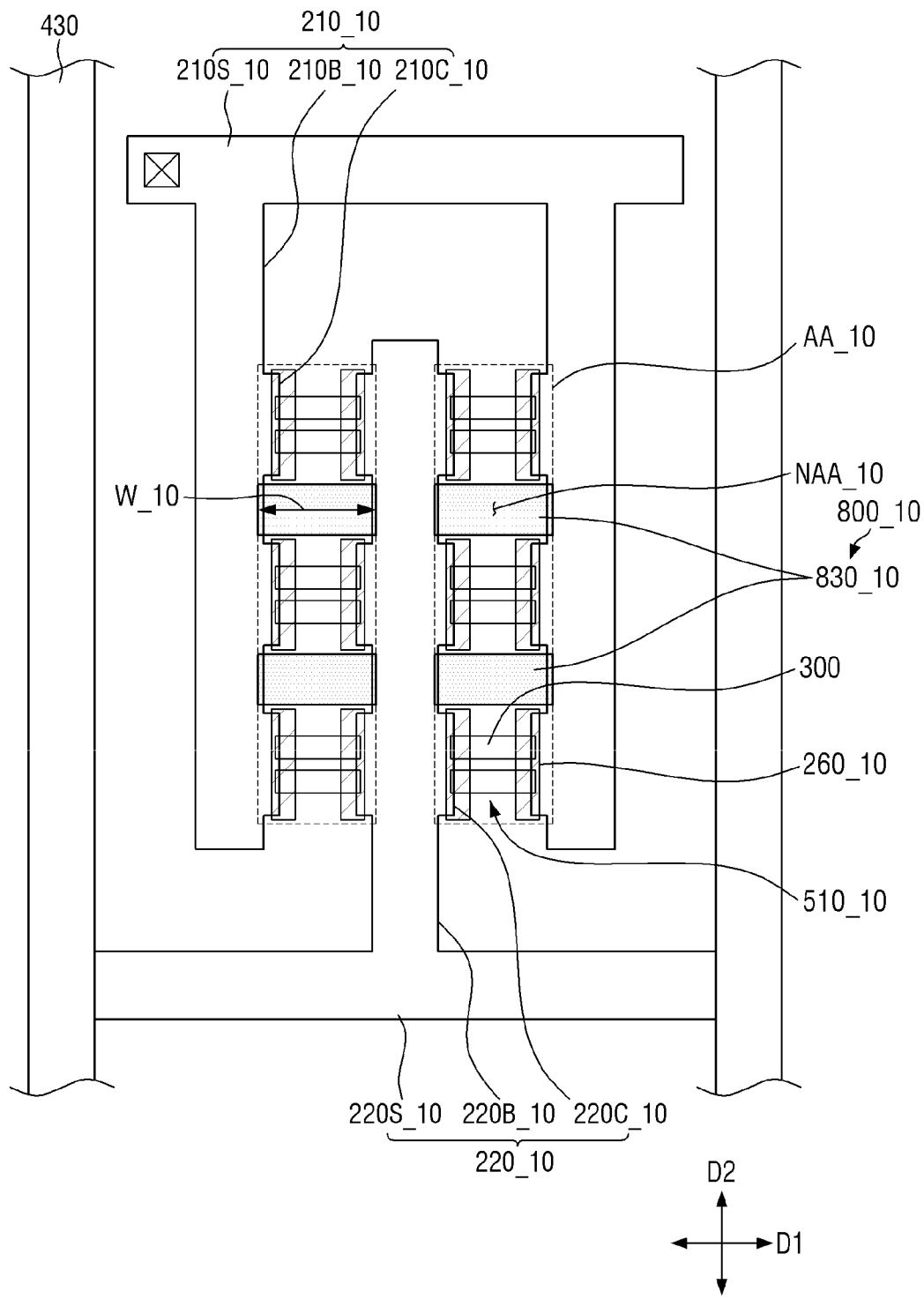

A display device 10_10 of FIG. 31 is substantially the same as the display device 10_8 of FIG. 29 except that a shielding electrode layer 800_10 includes a shielding electrode pattern 830_10 like the display device 10_6 of FIG. 25. A display device 10_11 of FIG. 32 is substantially the same as the display device 10_8 of FIG. 29 except that a shielding electrode layer 800_11 includes a shielding electrode pattern 830_11 like the display device 10_7 of FIG. 27.

That is, in the display device 10_10 of FIG. 31, a first electrode branch portion 210B_10 and a second electrode branch portion 220B_10 may include protruding pattern portions 210C_10 and 220C_10 formed by at least partial areas thereof protruding, and the shielding electrode layer 800_10 may include shielding electrode patterns 830_10 spaced apart from each other in a first direction D1 and a second direction D2 to form patterns. In the display device 10_10, a width W_10 of the shielding electrode pattern 830_10 measured in the first direction D1 may be greater than a distance between the first electrode branch portion 210B_10 and the second electrode branch portion 220B_10.

Figure 32:
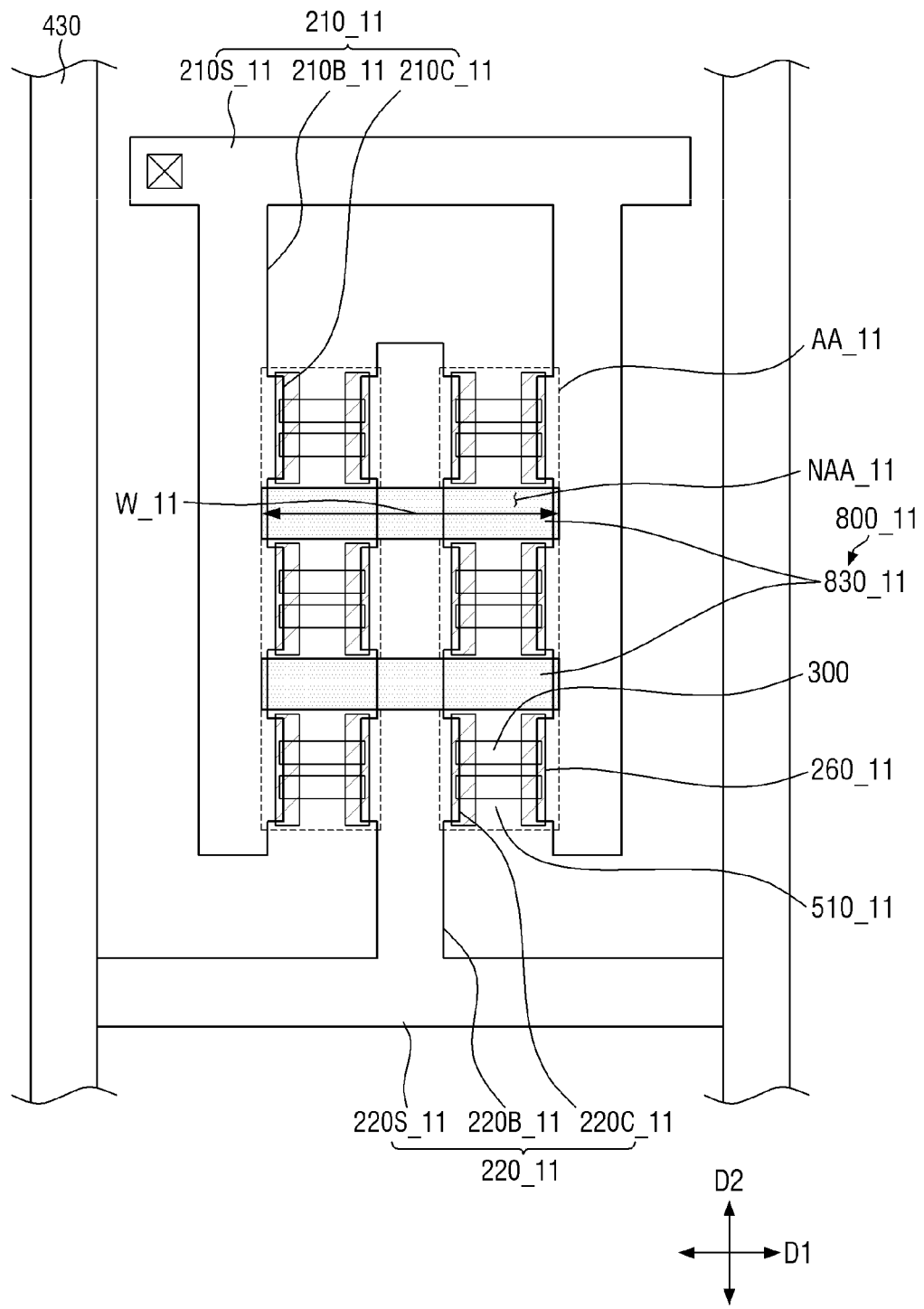

In the display device 10_11 of FIG. 32, a first electrode branch portion 210B_11 and a second electrode branch portion 220B_11 may include protruding pattern portions 210C_11 and 220C_11 formed by at least partial areas thereof protruding, and a shielding electrode layer 800_11 may include shielding electrode patterns 830_11 spaced apart from each other in a second direction D2 to form patterns. In the display device 10_11, a width W_11 of the shielding electrode pattern 830_11 measured in a first direction D1 may be greater than the sum of widths of electrode branch portions 210B_7 and 220B_7 and a distance between the electrode branch portions 210B_7 and 220B_7.

In concluding the detailed description, those skilled in the art will appreciate that many variations and modifications can be made to the embodiments without substantially departing from the principles of the present disclosure. Therefore, the disclosed embodiments of the disclosure are used in a generic and descriptive sense only and not for purposes of limitation.

The invention claimed is:

1. A display device comprising:
a first electrode, and a second electrode spaced apart from and facing the first electrode;
a first insulating layer covering at least partial areas of the first electrode and the second electrode, at least a portion of the first insulating layer being above the first electrode and the second electrode;
a shielding electrode layer above the first insulating layer, not overlapping at least portions of the first electrode and the second electrode; and
a light-emitting element above the first insulating layer, the light-emitting element being between the first electrode and the second electrode and spaced apart from the shielding electrode layer, wherein the light-emitting element is in an area in which the shielding electrode layer does not overlap the first electrode and the second electrode,
wherein the light-emitting element comprises a first conductivity-type semiconductor, a second conductivity-type semiconductor, and an active layer disposed between the first conductivity-type semiconductor and the second conductivity-type semiconductor, and
wherein the active layer, the first conductivity-type semiconductor, and the second conductivity-type semiconductor are disposed above the first insulating layer.

2. The display device of claim 1, wherein the shielding electrode layer comprises a first shielding electrode overlapping at least a portion of the first electrode, and a second shielding electrode spaced apart from the first shielding electrode and overlapping at least a portion of the second electrode.

3. The display device of claim 2, wherein the first electrode and the first shielding electrode are spaced apart from the second electrode and the second shielding electrode, respectively, in one direction across both ends of the light-emitting element, and
a separation distance between the first electrode and the second electrode is less than a separation distance between the first shielding electrode and the second shielding electrode.

4. The display device of claim 3, wherein a length of the light-emitting element measured in the one direction is greater than the separation distance between the first electrode and the second electrode and is less than the separation distance between the first shielding electrode and the second shielding electrode.

5. The display device of claim 2, further comprising:
a first contact electrode configured to be in contact with the first electrode, one end portion of the light-emitting element, and at least one end portion of the first shielding electrode; and
a second contact electrode configured to be in contact with the second electrode, another end portion of the light-emitting element, and at least one end portion of the second shielding electrode.

6. The display device of claim 5, further comprising a second insulating layer in at least a partial area on the first shielding electrode and the second shielding electrode,
wherein at least portions of the first contact electrode and the second contact electrode overlap an upper surface of the second insulating layer.

7. The display device of claim 1, wherein the shielding electrode layer comprises one or more shielding electrode patterns between the first electrode and the second electrode and spaced apart from each other in a direction in which the first electrode and the second electrode extend, and
the first insulating layer insulates the first electrode and the second electrode from the shielding electrode patterns.

8. The display device of claim 7, wherein the shielding electrode patterns do not overlap the first electrode and the second electrode.

9. The display device of claim 7, wherein the shielding electrode patterns partially overlap facing side surfaces of the first electrode and the second electrode.

10. The display device of claim 9, wherein a width of the shielding electrode pattern measured in a direction in which the first electrode and the second electrode are spaced apart from each other is greater than a distance between the first electrode and the second electrode.

11. The display device of claim 10, wherein the light-emitting element is between the shielding electrode patterns spaced apart from each other in the direction in which the first electrode and the second electrode extend.

12. A display device comprising:
a first electrode and a second electrode which extend in a first direction and are spaced apart from each other in a second direction different from the first direction;
a first insulating layer covering at least partial areas of the first electrode and the second electrode;
a shielding electrode layer on the first insulating layer, the shielding electrode layer extending in the first direction and not overlapping at least portions of the first electrode and the second electrode; and
a light-emitting element between the first electrode and the second electrode and spaced apart from the shielding electrode layer, both end portions of the light-emitting element being electrically coupled to the first electrode and the second electrode,
wherein the shielding electrode layer does not directly contact any one of the first electrode and the second electrode,
wherein portions of the first insulating layer are between the shielding electrode layer and the first electrode and between the shielding electrode layer and the second electrode, in a thickness direction of the display device,
wherein the light-emitting element comprises a first conductivity-type semiconductor, a second conductivity-type semiconductor, and an active layer disposed between the first conductivity-type semiconductor and the second conductivity-type semiconductor, and
wherein the active layer, the first conductivity-type semiconductor, and the second conductivity-type semiconductor are disposed above the first insulating layer.

13. The display device of claim 12, wherein the shielding electrode layer comprises:
a first shielding electrode comprising at least one first recess pattern portion on the first electrode and not overlapping at least a portion of the first electrode; and
a second shielding electrode comprising at least one second recess pattern portion on the second electrode and not overlapping at least a portion of the second electrode.

14. The display device of claim 13, wherein the first recess pattern portion is recessed from one side surface of the first shielding electrode facing the second electrode toward-another side surface of the first shielding electrode, and
the second recess pattern portion is recessed from one side surface of the second shielding electrode facing the first electrode toward toanother side surface of the second shielding electrode.

15. The display device of claim 14, wherein the first recess pattern portion and the second recess pattern portion are spaced apart from and face each other, and
the light-emitting element is between the first recess pattern portion and the second recess pattern portion.

16. The display device of claim 12, wherein the shielding electrode layer comprises a shielding electrode pattern portion between the first electrode and the second electrode, and
the shielding electrode pattern portion is spaced apart from another shielding electrode pattern portion adjacent thereto.

17. The display device of claim 16, wherein the shielding electrode pattern portion does not overlap the first electrode and the second electrode, and
the first insulating layer is exposed in a separation area between adjacent shielding electrode pattern portions to form a pattern in the first direction.

18. The display device of claim 16, wherein a width of the shielding electrode pattern portion in the second direction is greater than a distance between the first electrode and the second electrode in the second direction, and
the shielding electrode pattern portion partially overlaps the first electrode and the second electrode.

19. The display device of claim 12, wherein the first electrode comprises a first protrusion pattern protruding from at least a partial area of one side surface of the first electrode, which faces the second electrode, and
the second electrode-comprises a second protrusion pattern protruding from at least a partial area of one side surface of the second electrode, which faces the first electrode.

20. The display device of claim 19, wherein the first protrusion pattern and the second protrusion pattern are spaced apart from and face each other, and
one end of the light-emitting element is electrically coupled to the first protrusion pattern and another end of the light-emitting element is electrically coupled to the second protrusion pattern.

* * * * *